(12) United States Patent
Blalock et al.

(10) Patent No.: US 6,693,034 B2
(45) Date of Patent: *Feb. 17, 2004

(54) DEADHESION METHOD AND MECHANISM FOR WAFER PROCESSING

(75) Inventors: Guy T. Blalock, Boise, ID (US); Hugh E. Stroupe, Boise, ID (US); Brian F. Gordon, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/229,868

(22) Filed: Aug. 27, 2002

(65) Prior Publication Data

US 2003/0008508 A1 Jan. 9, 2003

Related U.S. Application Data

(63) Continuation of application No. 09/942,181, filed on Aug. 29, 2001, now Pat. No. 6,506,679, which is a continuation of application No. 09/387,429, filed on Sep. 2, 1999, now Pat. No. 6,316,363, which is a continuation of application No. 08/862,752, filed on May 23, 1997, now Pat. No. 6,331,488.

(51) Int. Cl.[7] .............................................. H01L 21/00
(52) U.S. Cl. .................... 438/691; 156/345.12; 216/38; 216/88; 438/692; 438/745
(58) Field of Search ..................... 156/345.12; 216/38, 216/88, 89, 91; 438/691, 692, 693, 745

(56) References Cited

U.S. PATENT DOCUMENTS

| 1,777,310 A | 10/1930 | Hopkinson |
| 2,373,770 A | 4/1945 | Martin |
| 2,431,943 A | 12/1947 | Land et al. |
| 3,120,205 A | 2/1964 | Pfeiffer et al. |
| 3,135,998 A | 6/1964 | Fowler et al. |

(List continued on next page.)

FOREIGN PATENT DOCUMENTS

| EP | 0 285 245 | 10/1988 |
| EP | 683 511 A2 | 11/1995 |
| EP | 683 511 A3 | 11/1995 |
| EP | 0 731 503 | 9/1996 |
| GB | 998210 | 7/1965 |
| WO | 90/12683 | 11/1990 |

OTHER PUBLICATIONS

Rothman, "Properties of Thin Polyimide Films", Journal of the Electrochemical Society: Solid–State Science and Technology, vol. 127, No. 10, Oct. 1980, pps. 2216–2220.

(List continued on next page.)

Primary Examiner—William A. Powell
(74) Attorney, Agent, or Firm—TraskBritt

(57) ABSTRACT

A method of manufacturing semiconductor devices using an improved planarization process for the planarization of the surfaces of the wafer on which the semiconductor devices are formed. The improved planarization process includes the formation of a flat planar surface from a deformable coating on the surface of the wafer using a fixed flexible planar interface material contacting the deformable material.

183 Claims, 13 Drawing Sheets

U.S. PATENT DOCUMENTS

| | | |
|---|---|---|
| 3,850,559 A | 11/1974 | Mintz et al. |
| 4,234,373 A | 11/1980 | Reavill et al. |
| 4,476,780 A | 10/1984 | Bunch |
| 4,700,474 A | 10/1987 | Choinski |
| 4,734,155 A | 3/1988 | Tsunoda et al. |
| 4,806,195 A | 2/1989 | Namysi |
| 4,810,672 A | 3/1989 | Schwarzbauer |
| 5,039,595 A | 8/1991 | Schwalm et al. |
| 5,049,232 A | 9/1991 | Tola |
| 5,078,820 A | 1/1992 | Hamamura et al. |
| 5,122,848 A | 6/1992 | Lee et al. |
| 5,124,780 A | 6/1992 | Sandhu et al. |
| 5,205,770 A | 4/1993 | Lowrey et al. |
| 5,232,875 A | 8/1993 | Tuttle et al. |
| 5,238,862 A | 8/1993 | Blalock et al. |
| 5,250,450 A | 10/1993 | Lee et al. |
| 5,261,997 A | 11/1993 | Inselmann |
| 5,286,329 A | 2/1994 | Iijima et al. |
| 5,300,155 A | 4/1994 | Sandhu et al. |
| 5,300,801 A | 4/1994 | Blalock et al. |
| 5,302,233 A | 4/1994 | Kim et al. |
| 5,302,343 A | 4/1994 | Jacob |
| 5,312,512 A | 5/1994 | Allman et al. |
| 5,314,843 A | 5/1994 | Yu et al. |
| 5,328,973 A | 7/1994 | Roeschert et al. |
| 5,331,018 A | 7/1994 | McGinniss et al. |
| 5,434,107 A | 7/1995 | Paranjpe |
| 5,492,858 A | 2/1996 | Bose et al. |
| 5,516,729 A | 5/1996 | Dawson et al. |
| 5,533,924 A | 7/1996 | Stroupe et al. |
| 5,554,065 A | 9/1996 | Clover |
| 5,558,015 A | 9/1996 | Miyashita et al. |
| 5,569,062 A | 10/1996 | Karlsrud |
| 5,575,707 A | 11/1996 | Talieh et al. |
| 5,618,381 A | 4/1997 | Doan et al. |
| 5,624,299 A | 4/1997 | Shendon |
| 5,624,300 A | 4/1997 | Kishii et al. |
| 5,624,303 A | 4/1997 | Robinson |
| 5,624,304 A | 4/1997 | Pasch et al. |
| 5,629,242 A | 5/1997 | Nagashima et al. |
| 5,639,697 A | 6/1997 | Weling et al. |
| 5,643,046 A | 7/1997 | Katakabe et al. |
| 5,643,050 A | 7/1997 | Chen |
| 5,643,406 A | 7/1997 | Shimomura et al. |
| 5,643,837 A | 7/1997 | Hayashi |
| 5,650,261 A | 7/1997 | Winkle |
| 5,679,610 A | 10/1997 | Matsuda et al. |
| 5,691,100 A | 11/1997 | Kudo et al. |
| 5,700,890 A | 12/1997 | Chou |
| 5,736,424 A | 4/1998 | Prybyla et al. |
| 5,846,690 A | 12/1998 | Padmanaban et al. |
| 5,967,030 A | 10/1999 | Blalock |
| 6,062,133 A | 5/2000 | Blalock |
| 6,218,316 B1 | 4/2001 | Marsh |
| 6,316,363 B1 | 11/2001 | Blalock et al. |
| 6,331,488 B1 | 12/2001 | Doan et al. |
| 6,403,499 B2 | 6/2002 | Marsh |
| 6,420,214 B1 | 7/2002 | Brooks et al. |
| 6,506,679 B2 * | 1/2003 | Blalock et al. ..... 156/345.12 X |
| 6,518,172 B1 | 2/2003 | Blalock et al. |

OTHER PUBLICATIONS

Moran et al., "High Resolution, Steep Profile Resist Patterns", J. Vac. Sci. Technology, vol. 16(6), Nov./Dec. 1979, pps. 1620–1624.

Yoshino et al., "Photoacid Structure Effects on Environmental Stability of 193 nm Chemically Amplified Positive Resists", IEEE, pps. 76–77.

Ito, "Chemical Amplification Resists: History and Development Within IBM", IBM J. Res. Develop., vol. 41, No. 1/2, Jan.–Mar. 1997, pps. 69–80.

Rothschild et al., "Lithography at a Wavelength of 193 nm", IBM J. Res. Develop., vol. 41, No. 1/2, Jan.–Mar. 1997, pps. 49–55.

White, "Planarization Properties of Resist and Polyimide Coatings", Journal of the Electrochemical Society: Solid–State Science and Technology, Jul. 1983, pps. 1543–1548.

Allen et al., "Photoresists for 193–nm Lithography", IBM J. Res. Develop., vol. 41, No. 1/2, Jan.–Mar. 1997, pps. 95–104.

Seeger et al., "Thin–film Imaging: Past, Present, Prognosis", IBM J. Res. Develop., vol. 41, No. 1/2, Jan.–Mar. 1997, pps. 105–118.

Shaw et al., "Negative Photoresists for Optical Lithography", IBM J. Res. Develop., vol. 41, No. 1/2, Jan.–Mar. 1997, pps. 81–94.

Exhibit A, 2 pages.

Cameron et al., "Photogeneration of Organic Bases from o–Nitrobenzyl–Derived Carbamates", J. Am. Chem. Society, 1991, 113, pps. 4304–4313.

Cameron et al., "Base Catalysis in Imaging Materials", J. Org. Chem., 1990, 55, pps. 5919–5922.

Guckel et al., "Deep X–Ray and UV Lithographies for Micromechanics", 1990 IEEE, pps. 118–122.

Pederson et al., "Characterization of a Photoresist with Wavelength Selected Tone", 1990 IEEE, pps. 1828–1835.

Bousaba et al., "Plasma Resistant Modified I–Line, Deep UV, and E–Beam Resists", 1995 IEEE, pps. 195–200.

* cited by examiner

DEADHESION METHOD AND MECHANISM FOR WAFER PROCESSING

CROSS-REFERENCE TO RELATED APPLICATIONS

This application is a continuation of application Ser. No. 09/942,181, filed Aug. 29, 2001, now U.S. Pat. No. 6,506,679, which is a continuation of application Ser. No. 09/387,429, filed Sep. 2, 1999, now U.S. Pat. No. 6,316,363, issued Nov. 13, 2001, which is related to application Ser. No. 08/862,752, filed May 23, 1997, now U.S. Pat. No. 6,331,488, issued Dec. 18, 2001.

BACKGROUND OF THE INVENTION

1. Field of the Invention

The present invention relates to the manufacturing of semiconductor devices. More particularly, the present invention relates to an improved method and mechanism using a flexible planar interface material for wafer processing for the planarization of surfaces in the manufacturing of a semiconductor.

2. State of the Art

Typically, integrated circuits are manufactured by the deposition of layers of predetermined materials to form the desired circuit components on a silicon wafer semiconductor substrate. As the layers are deposited on the wafer substrate to form the desired circuit component, the planarity of each of the layers is an important consideration because the deposition of each layer produces a rough, or nonplanar, topography initially on the surface of the wafer substrate and, subsequently, on any previously deposited layer of material. Typically, photolithographic processes are used to form the desired circuit components on the wafer substrate. When such photolithographic processes are pushed to their technological limits of circuit formation, the surface on which the processes is used must be as planar as possible to ensure success in circuit formation. This results from the requirement that the electromagnetic radiation used to create a mask, which is used in the formation of the circuits of the semiconductor devices in wafer form, must be accurately focused at a single level, resulting in the precise imaging over the entire surface of the wafer. If the wafer surface is not sufficiently planar, the resulting mask will be poorly defined causing, in turn, a poorly defined circuit which may malfunction. Since several different masks are used to form the different layers of circuits of the semiconductor devices on the substrate wafer, any nonplanar areas of the wafer will be magnified in later deposited layers.

After layer formation on the wafer substrate, either a chemical etch-back process of planarization, or a global press planarization process typically followed by a chemical etch-back process of planarization, or a chemical mechanical planarization process may be used to planarize the layers before the subsequent deposition of a layer of material thereover. In this manner, the surface irregularities of a layer may be minimized so that subsequent layers disposed thereon do not substantially reflect the irregularities of the underlying layer.

One type of chemical etch-back process of planarization, illustrated in EUROPEAN PATENT APPLICATION 0 683 511 A2, uses a coating technique in which an object having a flat surface is used to planarize a coating material applied to the wafer surface prior to a plasma reactive ion etching process being used to planarize the wafer surface. Often, however, the planarization surface will contain defects, such as pits or other surface irregularities. These may result from defects in the flat surface used for planarizing or from foreign material adhering to the flat surface. The etching of such a wafer surface having irregularities will, at best, translate those undesirable irregularities to the etched surface. Further, since some etching processes may not be fully anisotropic, etching such irregular surfaces may increase the size of the defects in the etched wafer surface.

One type of global press planarization process, illustrated in U.S. Pat. No. 5,434,107, subjects a wafer with features formed thereon having been coated with an inter-level dielectric material to an elevated temperature while an elevated pressure is applied to the wafer using a press until the temperature and pressure conditions exceed the yield stress of the upper film on the wafer so that the film will attempt to be displaced into and fill both the microscopic and local depressions in the wafer surface. It should be noted that the film is only deformed locally on the wafer, not globally, during the application of elevated temperature and pressure since the object contacting the surface of the wafer will only contact the highest points or areas on the surface of the wafer to deform or displace such points or areas of material locally, not globally displace the material on the entire wafer surface. Other nonlocal depressions existing in the wafer are not affected by the pressing, as sufficient material is not displaced thereinto. Subsequently, the temperature and pressure are reduced so that the film will become firm again, thereby leaving localized areas having a partially planar upper surface on portions of the wafer while other portions of the wafer surface will remain nonplanar.

In one instance, global planar surfaces are created on a semiconductor wafer using a press located in a chamber. Referring to drawing FIG. 1, a global planarization apparatus 100 is illustrated. The global planarization apparatus 100 serves to press the surface of a semiconductor wafer 120 having multiple layers including a deformable outermost layer 122 against a fixed pressing surface 132. The surface of the deformable layer 122 will assume the shape and surface characteristics of the pressing surface 132 under the application of force to the wafer 120. The global planarization apparatus 100 includes a fully enclosed apparatus having a hollow cylindrical chamber body 112 and having open top and bottom ends, 113 and 114 respectively, and interior surface 116 and an evacuation port 111. A base plate 118 having an inner surface 117 is attached to the bottom end 114 of chamber body 112 by bolts 194. A press plate 130, is removably mounted to the top end 113 of chamber body 112 with pressing surface 132 facing base plate 118. The interior surface 116 of chamber body 112, the pressing surface 132 of press plate 130 and the inner surface 117 of base plate 118 define a sealable chamber. Evacuation port 111 can be positioned through any surface, such as through base plate 118, and not solely through chamber body 112.

The press plate 130 has a pressing surface 132 with dimensions greater than that of wafer 120 and being thick enough to withstand applied pressure. Press plate 130 is formed from nonadhering material capable of being highly polished so that pressing surface 132 will impart the desired smooth and flat surface quality to the surface of the deformable layer 122 on wafer 120. Preferably, the press plate is a disc-shaped quartz optical flat.

A rigid plate 150 having top and bottom surfaces 152 and 154, respectively, and lift pin penetrations 156 therethrough, is disposed within chamber body 112 with the top surface 152 substantially parallel to and facing the pressing surface 132. The rigid plate 150 is constructed of rigid material to transfer a load under an applied force with minimal deformation.

A uniform force is applied to the bottom surface 154 of rigid plate 150 through the use of a bellows arrangement 140 and relatively pressurized gas to drive rigid plate 150 toward pressing surface 132. Relative pressure can be achieved by supplying gas under pressure or, if the chamber body 112 is under vacuum, allowing atmospheric pressure into bellows 140 to drive the same. The bellows 140 is attached at one end to the bottom surface 154 of rigid plate 150 and to the inner surface 117 of base plate 118 with a bolted mounting plate 115 to form a pressure containment that is relatively pressurized through port 119 in base plate 118. One or more brackets 142 are mounted to the inner surface 117 of the base plate 118 to limit the motion toward base plate 118 of the rigid plate 150, when bellows 140 is not relatively pressurized. The application of force through the use of a relatively pressurized gas ensures the uniform application of force to the bottom surface 154 of rigid plate 150. The use of rigid plate 150 will serve to propagate the uniform pressure field with minimal distortion. Alternately, the bellows 140 can be replaced by any suitable means for delivering a uniform force, such as a hydraulic means.

A flexible pressing member 160 is provided having upper and lower surfaces 162 and 164, respectively, which are substantially parallel to the top surface 152 of rigid plate 150 and pressing surface 132. Lift pin penetrations 166 are provided through pressing member 160. The flexible pressing member 160 is positioned with its lower surface 164 in contact with the top surface 152 of rigid plate 150 and lift pin penetrations 166 aligned with lift pin penetrations 156 in rigid plate 150. The upper surface 162 of the flexible pressing member 160 is formed from a material having a low viscosity that will deform under an applied force to close lift pin penetrations 166 and uniformly distribute the applied force to the wafer 120, even when the top surface 152, the upper surface 162 and/or the lower surface 164 are not completely parallel to the pressing surface 132 or when thickness variations exist in the wafer 120, rigid plate 150 or flexible pressing member 160, as well as any other source of nonuniformly applied force.

Lift pins 170 are slidably disposable through lift pin penetrations, 156 and 166, respectively, in the form of apertures, to contact the bottom surface 126 of wafer 120 for lifting the wafer 120 off the upper surface 162 of flexible pressing member 160. Movement of the lift pins 170 is controlled by lift pin drive assembly 172, which is mounted on the inner surface 117 of the base plate 118. The lift pin drive assembly 172 provides control of the lift pins 170 through conventional means. Lift pins 170 and lift pin drive assembly 172 are preferably positioned outside the pressure boundary defined by the bellows 140 to minimize the number of pressure boundary penetrations. However, they can be located within the pressure boundary, if desired, in a suitable manner.

A multipiece assembly consisting of lower lid 180, middle lid 182, top lid 184, gasket 186 and top clamp ring 188 is used to secure the press plate 130 to the top end 113 of chamber body 112. The ring-shaped lower lid 180 is mounted to the top end 113 of chamber body 112 and has a portion with an inner ring dimension smaller than press plate 130 so that press plate 130 is seated on lower lid 180. Middle lid 182 and top lid 184 are ring-shaped members having an inner ring dimension greater than press plate 130 and are disposed around press plate 130. Middle lid 182 is located between lower lid 180 and top lid 184. A gasket 186 and top clamp ring 188 are members having an inner ring dimension less than that of press plate 130 and are seated on the surface of press plate 130 external to the chamber. Bolts 194 secure press plate 130 to the chamber body 112.

Heating elements 190 and thermocouples 192 control the temperature of the wafer 120 having deformable layer 122 thereon, flexible pressing member 160 and other components of the global planarization apparatus 100 located within chamber body 112.

In operation, the top clamp ring 188, gasket 186, upper lid 184, and middle lid 182 are removed from the chamber body 112 and the press plate 130 lifted from lower lid 180. The bellows 140 is deflated and rigid plate 150 is seated on standoff brackets 142. The wafer 120 is placed on the flexible pressing member 160 with the side of the wafer 120 opposite the deformable layer 122 in contact with flexible pressing member 160. The press plate 130 is mounted on the lower lid 180, and the middle lid 182 and upper lid 184 are installed and tightened using gasket 186 and top clamp ring 188, sealing press plate 130 between top clamp ring 188 and lower lid 180. The temperature of flexible pressing member 160, press plate 130, wafer 120 having deformable layer 122 thereon, and rigid plate 150 is adjusted through the use of heating elements 190 monitored by thermocouples 192 to vary the deformation characteristics of the deformable layer 122 of wafer 120. Chamber body 112 is evacuated through port 119 to a desired pressure.

A pressure differential is established between the interior and exterior of the bellows 140, whether by pressurizing or by venting when the chamber body 112 having been evacuated thereby drives rigid plate 150, flexible pressing member 160, and wafer 120 toward press plate 130 and brings deformable layer 122 of wafer 120 into engagement with pressing surface 132 of press plate 130. Upon engagement of wafer 120 with press plate 130, the continued application of force will deform the flexible pressing member 160 which, in turn, serves to close lift pin penetrations 166 and distribute the force to ensure the wafer 120 experiences uniform pressure on its deformable layer 122. After the wafer 120 has been in engagement with pressing surface 132 for sufficient time to cause its deformable layer 122 to globally correspond to the pressing surface 132, the deformable layer 122 is hardened or cured. The pressure is released from the bellows 140, thereby retracting wafer 120, flexible pressing member 160, and rigid plate 150 from the press plate 130. The downward movement of rigid plate 150 will be terminated by its engagement with standoff brackets 142.

Once the rigid plate 150 is fully retracted, the vacuum is released in chamber body 112. Lift pins 170 are moved through lift pin penetrations 156 in the rigid plate 150 and lift pin penetrations 166 in the flexible pressing member 160 to lift wafer 120 off the flexible pressing member 160. The top clamp ring 188, gasket 186, top lid 184, middle lid 182, and press plate 130 are removed and the wafer 120 is removed off lift pins 170 for further processing.

Once the wafer is removed, it will be subjected to an etch to establish the planar surface at the desired depth. A system used or depicted in FIG. 1 provides an optimal method of deforming a flowable, curable material to form a generally planarized surface. However, the method is still subject to yielding a wafer surface with irregularities therein, and the need for the subsequent etch to define the desired surface height will still result in undesirable transfer and possible enlargement of any such surface irregularities.

Conventional chemical mechanical planarization processes are used to planarize layers formed on wafer substrates in the manufacture of integrated circuit semiconductor devices. Typically, a chemical mechanical planarization (CMP) process planarizes a nonplanar irregular surface of a wafer by pressing the wafer against a moving polishing surface that is wetted with a chemically reactive, abrasive slurry. The slurry is usually either basic or acidic and generally contains alumina or silica abrasive particles. The polishing surface is usually a planar pad made of a relatively soft, porous material, such as a blown polyurethane, mounted on a planar platen.

Referring to drawing FIG. 2, a conventional chemical mechanical planarization apparatus is schematically illustrated. A semiconductor wafer 12 is held by a wafer carrier 11. A soft, resilient pad 13 is positioned between the wafer carrier 11 and the wafer 12. The wafer 12 is held against the pad 13 by a partial vacuum. The wafer carrier 11 is continuously rotated by a drive motor 14 and is also designed for transverse movement as indicated by the arrows 15. The rotational and transverse movement is intended to reduce variability in material removal rates over the surface of the wafer 12. The apparatus further comprises a rotating platen 16 on which is mounted a polishing pad 17. The platen 16 is relatively large in comparison to the wafer 12, so that during the chemical mechanical planarization process, the wafer 12 may be moved across the surface of the polishing pad 17 by the wafer carrier 11. A polishing slurry containing a chemically reactive solution, in which abrasive particles are suspended, is delivered through a supply tube 18 onto the surface of the polishing pad 17.

Referring to drawing FIG. 3, a typical polishing table is illustrated in top view. The surface of the polishing table 1 is precision machined to be flat and may have a polishing pad affixed thereto. The surface of the table rotates the polishing pad past one or more wafers 3 to be polished. The wafer 3 is held by a wafer holder, as illustrated hereinbefore, which exerts vertical pressure on the wafer against the polishing pad. The wafer holder may also rotate and/or orbit the wafer on the table during wafer polishing.

Alternately, the table 1 may be stationary and serve as a supporting surface for individual polishing platens 2, each having their own individual polishing pad. As illustrated in U.S. Pat. No. 5,232,875, each platen may have its own mechanism for rotating or orbiting the platen 2. A wafer holder will bring a wafer in contact with the platen 2 and an internal or external mechanism to the wafer holder may be used to also rotate the wafer during the polishing operation. In a polishing table having multiple individual platens, each platen must be precision machined.

The wafers 3 are typically stored-and transported in wafer cassettes which hold multiple wafers. The wafers 3 or wafer holders are transported between the wafer cassettes and the polishing table 1 using the wafer transport arm 4. The wafer transport arm 4 will transport the wafers 3 between the polishing table and the stations 5, which may be wafer cassette stations or wafer monitoring stations.

The polishing characteristics of the polishing pad will change during use as multiple wafers 3 are polished. The glazing or changing of the polishing characteristics will affect the planarization of the surface of the wafers 3 if the pads are not periodically conditioned and unglazed. The pad conditioner 6 is used to periodically unglaze the surface of the polishing pad. The pad conditioner 6 has a range of motion which allows it to come in contact with the individual pads and conduct the unglazing period and then to move to its rest position.

The pressure between the surface of the wafer to be polished and the moving polishing pad may be generated by either the force of gravity acting on the wafer and the wafer carrier or a mechanical force applied normally to the wafer surface. The slurry may be delivered or injected through the polishing pad onto its surface. The planar platens may be moved in a plane parallel to the pad surface with either an orbital, fixed-direction vibratory or random direction vibratory motion.

While a chemical mechanical planarization process is an effective process to planarize the surface of a wafer, variations in height on the surface to be planarized by the chemical mechanical planarization process, although minimized through the chemical mechanical planarization process, will often not be completely removed to yield an optimally planar surface. As is well known in the art, the chemical mechanical planarization process polishing pad will deform, or "dish," into recesses between structures of the surface of the wafer. The structure spacing on the wafer which will yield this "dishing" is clearly a function of various factors, such as the pad composition, the polishing pressure, etc. This pad "dishing" will clearly lead to less than optimal planarization of the surface of the wafer. Further, the surface irregularities extending into or down to the wafer surface being planarized tend to collect slurry, thereby causing such areas of the wafer to be subjected to the corrosive effects of the slurry longer than other areas of the wafer surface which do not collect the slurry.

To help minimize polishing pad deformation (dishing) caused by surface irregularities formed by the integrated circuit components on the wafer surface, dummy structures have also been included on the wafer surface in an attempt to provide a more uniform spacing of structures on the wafer surface. While the use of such dummy structures will often be useful, the ultimate result is also highly dependent upon the later chemical mechanical planarization process conditions.

Alternately, a dry isotropic etching process may be used to etch the surface on a wafer for planarization to facilitate planarization of the wafer surface irregularities, rather than use a chemical mechanical planarization process.

Therefore, a need exists to reduce the surface irregularities on a wafer before a planarization process, such as a chemical mechanical planarization process or a dry etching process, is used to facilitate planarization of the wafer.

BRIEF SUMMARY OF THE INVENTION

The present invention relates to the manufacturing of semiconductor devices. More particularly, the present invention relates to an improved method and mechanism using a flexible interface material for wafer processing for the global planarization of surfaces in the manufacturing of semiconductor devices. The present invention comprises an improved method and apparatus for the global planarization of a deformable surface of a wafer using a flexible planar interface material prior to the planarization of the wafer using either an etching planarization method or a chemical mechanical planarization method on the wafer.

The present invention will be better understood when the drawings are taken in conjunction with the description of the present invention hereafter.

DETAILED DESCRIPTION OF THE INVENTION

Figure 4:
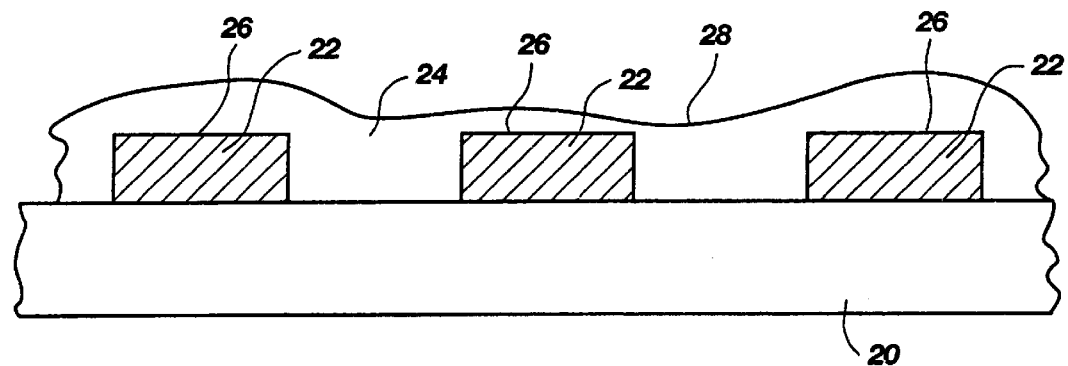
FIG. 4 is a cross-sectional view of a portion of a wafer substrate having electrical circuit components formed thereon and a coating thereover.

Referring to drawing FIG. 4, a portion of a wafer substrate 20 is illustrated having portions of electrical circuit components 22 formed thereon and a coating of insulating material 24, typically a metallic material, a semiconductor material, or an insulating material, covering the electrical circuit components 22 and portions of the wafer substrate 20 located between the electrical circuit components 22. As illustrated, the portions of the electrical circuit components 22 are formed having upper surfaces 26 thereon while the coating of insulating material 24 is formed having an irregular nonplanar surface 28 extending over the surfaces 26 of the electrical circuit components 22. The insulating material 24 typically comprises an insulating oxide or other dielectric material and may include a plurality of layers of such insulating or other types of material, as desired. In this instance, for convenience, the insulating material 24 is illustrated covering the wafer substrate 20 and the electrical circuit components 22 thereon, regardless of the number of layers thereof.

It can be easily seen that if only portions of the surface 28 of insulating material 24 are removed for the formation of additional electrical circuit components, the nonplanar surface of the insulating material 24 would cause masking and etching problems as the masking of the insulating material 24, as well as the etching thereof, would not be uniform. Therefore, the surface 28 must be globally planarized to facilitate further electrical circuit component formation.

At this juncture, if a conventional chemical mechanical planarization process is used on the wafer substrate 20, the surface of the wafer will be subject to a reactive slurry and one or more polishing pads used in the process in an attempt to form a planar surface on the insulating material 24 covering the electrical circuit components 22. Some of the problems associated with such a conventional chemical mechanical planarization process are that the reactive slurry is unevenly distributed about the wafer substrate 20. In addition, the particulates removed from the substrate 20 and insulating material 24 during the polishing process may become lodged in the polishing pad, forming a glaze thereon and thereby affecting the rate of removal by the pad and causing the polishing pad to unevenly remove material during the process. As the chemical mechanical planarization process begins, by polishing an irregular surface on the wafer, such surface causes the deformation of the polishing pad (dishing), thereby further inducing irregularities not initially present in the surface being polished. The irregularities of the surface of the wafer induced during the chemical mechanical planarization of the wafer surface are caused by the dishing of the polishing pad, the force applied thereto, and the deformation of the pad by surface areas of the wafer. Therefore, before starting a chemical mechanical planarization process of the surface of a wafer, it is desirable to have the surface planarized as nearly planar as possible to help ensure the even removal of material therefrom and to help eliminate the deformation of the polishing pad(s) being used to thereby, in turn, help minimize any surface irregularities being introduced into the surface being planarized by such pad deformation.

Similarly, if a conventional dry etching planarization process in a conventional etcher is used on the wafer substrate 20, the surface of the wafer will be subject to a reactive process by the gases used in the etching process in an attempt to form a planar surface on the insulating material 24 covering the electrical circuit components 22. Some of the problems associated with such a conventional dry etching planarization process are that if the surface 28 of the insulating material 24 is not planar and is deformed, the isotropic etching of the insulating material 24 will result in a nonplanar surface, that the reactive gases may be unevenly distributed about the wafer substrate 20 thereby further causing uneven etching of the surface 28 of the insulating material 24 on the substrate 20 resulting in an increased nonplanar surface 28, and that any irregularities in the surface of the substrate 20 will be etched at different rates by the gases used in the dry etching planarization process causing the same or greater irregularities in the surface of the substrate 20. Simply stated, if the surface 28 of the insulating material 24 is nonplanar or bumpy, the isotropic etching thereof will result in a nonplanar or bumpy surface 28.

Figure 5:
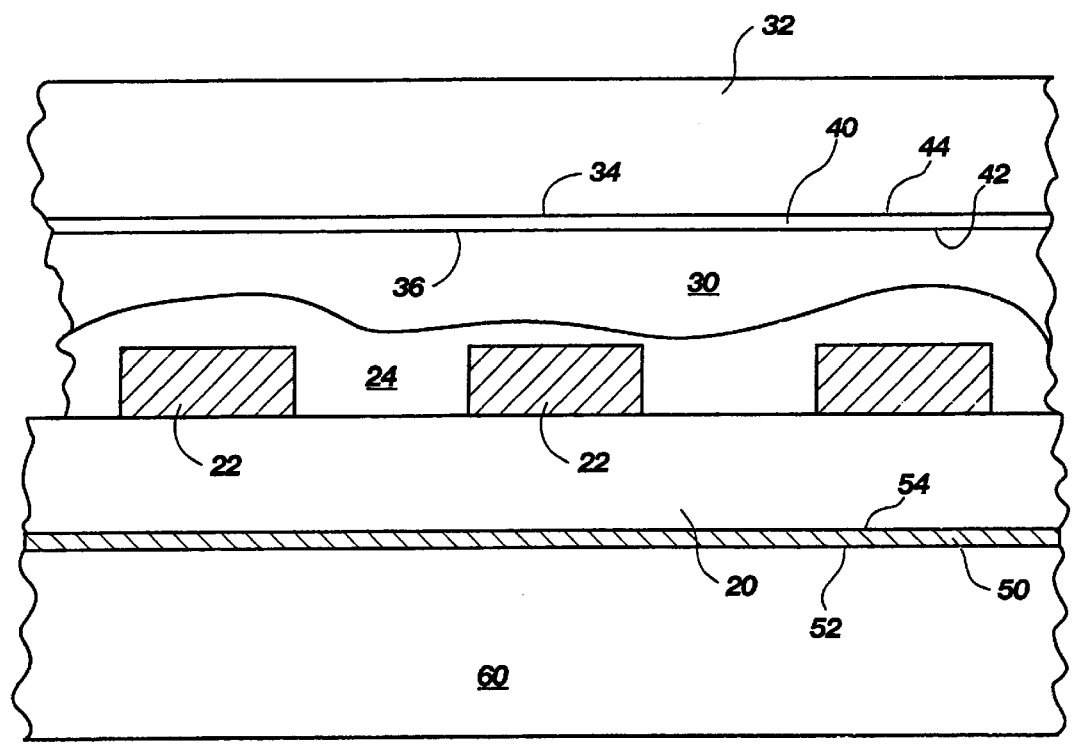
FIG. 5 is a cross-sectional view of a portion of a wafer substrate having electrical circuit components formed thereon, a coating thereover, a deformable coating, and a portion of a flat pressing member and flexible planar interface material used in the present invention.

Referring to drawing FIG. 5, the improved planarization process of the present invention is illustrated in relation to a wafer substrate 20 having electrical circuit components 22 thereon and a coating of insulating material 24 thereover. In the improved planarization process of the present invention, prior to the initiation of the planarization of the substrate 20, electrical circuit components 22 and insulating material 24, a layer of deformable material 30 is coated or deposited over the insulating material 24. The deformable material 30 may be of any suitable type material that readily flows over the surface 28 of the insulating material 24 and that is subsequently solidified through curing or hardening or other type of solidification. Alternately, the deformable material 30, in some instances, may be a readily deformable metal capable of being deformed under low temperature and low pressure which may be readily deposited over the insulating material 24 through well-known techniques and processes. Whatever the type of deformable material 30, the deformable material 30 is applied over the insulating material 24 to any desired depth but is typically applied in a thickness greater than the thickness of the surface topography of the wafer. The thickness of the deformable material 30 initially applied to the wafer depends upon the type of material selected for such use and the dimensions of the surface irregularities, etc. After the application of the layer of deformable material 30 to the insulating material 24 and before the deformable material 30 has cured, hardened, or solidified to the point where it is incapable of being deformed, an object 32 having a flat planar surface 34 thereon and a flexible planar interface material 40, which is fixed or immovable with respect to the substrate 20, are forced under pressure into the deformable material 30 to form a flat, planar surface 36 thereon and are kept in contact with the deformable material 30 while the deformable material 30 cures, hardens, or solidifies. The object 32 may be of any well-known suitable material, such as an optical grade or optical quality quartz disc-shaped object, glass disc-shaped object, ceramic disc-shaped object, stone disc-shaped object or any desired material disc-shaped object, having a desired flat, planar surface thereon which may be used to press into the deformable material 30 to form a flat, planar surface 36 thereon. If desired, the object 32 may be tailored to meet process requirements of the desired range of pressure to be applied to the deformable material 30 and the method of curing, hardening or solidifying the deformable material 30. Further, if desired, the flat planar surface 34 of the object 32 may have a shape other than a flat, planar surface, such as either a concave surface, convex surface, concave and convex surface, or any type desired surface suitable in a chemical mechanical planarization process. Additionally, the flat planar surface 34 of the object 32 may be coated with a suitable release agent coating to facilitate its removal from the flexible planar interface material 40 after the curing, hardening or solidification of the deformable material 30. The flexible planar interface material 40 may be any suitable material, such as planar Teflon™ sheet material or the like having a high degree of planarity between the upper and lower surfaces thereof. Alternately, the flexible planar interface material 40 may comprise a flexible planar sheet of metal, a flexible planar sheet of polymeric material, etc. The flexible planar interface material 40 may either allow the transmission of a broad spectrum of light therethrough or be opaque to a broad spectrum of light. If the flexible planar interface material is of Teflon™, it is preferable that the flexible planar interface material 40 have a thickness in the range of 0.010 inches to 0.040 inches. It is further preferable that the thickness of the Teflon™ flexible planar interface material 40 be approximately 0.010 inches. The flexible planar interface material 40 is used to facilitate the release of the object 32 from the flat planar surface 36 of the deformable material 30 after the curing, hardening or solidification thereof. If desired, the flexible planar interface material 40 may also be coated with a suitable release agent coating to facilitate its removal from the deformable material 30 after the curing, hardening, or solidification thereof and/or to facilitate its removal from the object 32. The substrate 20 is preferably removed from the flexible planar interface material 40 by applying fluid under pressure, preferably a burst of fluid under pressure, between the object 32 and the flexible planar interface material 40 to cause the substrate 20 to be removed therefrom by the fluid under pressure, causing the flexible planar interface material 40 to either flex, ripple, deform, or bow or flex, ripple, deform, and bow as the fluid flows into the space between the object 32 and the flexible planar interface material 40. After the substrate 20 is removed from the flexible planar interface material 40, a vacuum may be applied to the space between the object 32 and the flexible planar interface material 40 to cause the flexible planar interface material 40 to engage the flat planar surface 34 of object 32.

The deformable material 30 may be any suitable well-known organic type, such as monomers, monomer mixtures, oligomers, and oligomer mixtures that are solidified through curing. Alternately, the deformable material 30 may be any suitable type epoxy resin which may be cured using an acid catalyst.

The object 32 and flexible planar interface material 40 are kept through the application of suitable pressure thereto, or application of pressure to the wafer substrate 20, or the application of pressure to both the object 32 and the wafer substrate 20 in engagement with the deformable material 30 until such material has hardened or solidified to form a permanently flat, planar surface 36 thereon being the mirror image of the flat, planar surface 34 of the object 32. At such time, the object 32 and the flexible planar interface material 40 are removed from engagement with the deformable material 30 using the application of fluid under pressure to the space between the object 32 and the flexible planar interface material 40.

Also illustrated in drawing FIG. 5, is a flexible resilient member 50, having surfaces 52 and 54 thereon, comprising a suitably shaped member compatible with the wafer substrate 20 formed of resilient material which will deform under an applied force to uniformly distribute the applied force from the object 32 to the deformable material 30, even if the flat planar surface 34 of object 32, the surfaces of flexible planar interface material 40, illustrated as surfaces 42 and 44 of the flexible planar interface material 40, and the flat planar surface 36 of deformable material 30 on the wafer substrate 20 are not substantially parallel to each other or, alternately, when thickness variations locally exist within either the wafer substrate 20, electrical circuit components 22, insulating material 24, object 32, and/or flexible resilient member 50. It is preferred that the flexible resilient member 50 be thermally stable and resistant to the temperature ranges of operation experienced during the pressing by object 32 and flexible planar interface material 40 and that the flexible resilient member 50 be formed from a low viscosity and low durometer hardness material. In this manner, the flexible resilient member 50 serves to compensate for the variations in the thickness of the wafer substrate 20, electrical circuit components 22, insulating material 24, deformable material 30, object 32, and flexible planar interface material 40, as well as compensating for any nonparallel surfaces on the object 32 or the flexible planar interface material 40 or the wafer substrate 20 or the substrate or support 60 (150□ in drawing FIG. 14) on which the wafer substrate 20 is supported during the pressing of object 32 to form flat planar surface 36 on the deformable material 30 prior to beginning the planarization process thereafter. The preferable manner in which the insulating material 24 on a wafer substrate 20 is to be globally planarized by etching or chemical mechanical planarization to have a globally flat, planar surface 28' (FIG. 7) is to use the global planarization process and apparatus described herein.

Figure 2:
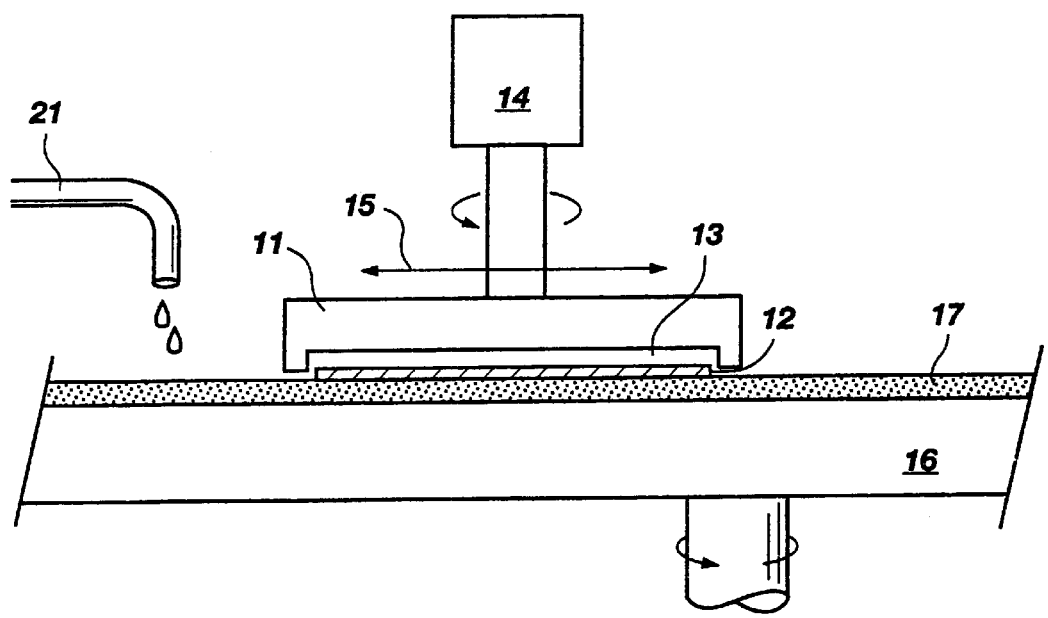
FIG. 2 is an illustration of a conventional rotational chemical mechanical planarization apparatus.
Figure 3:
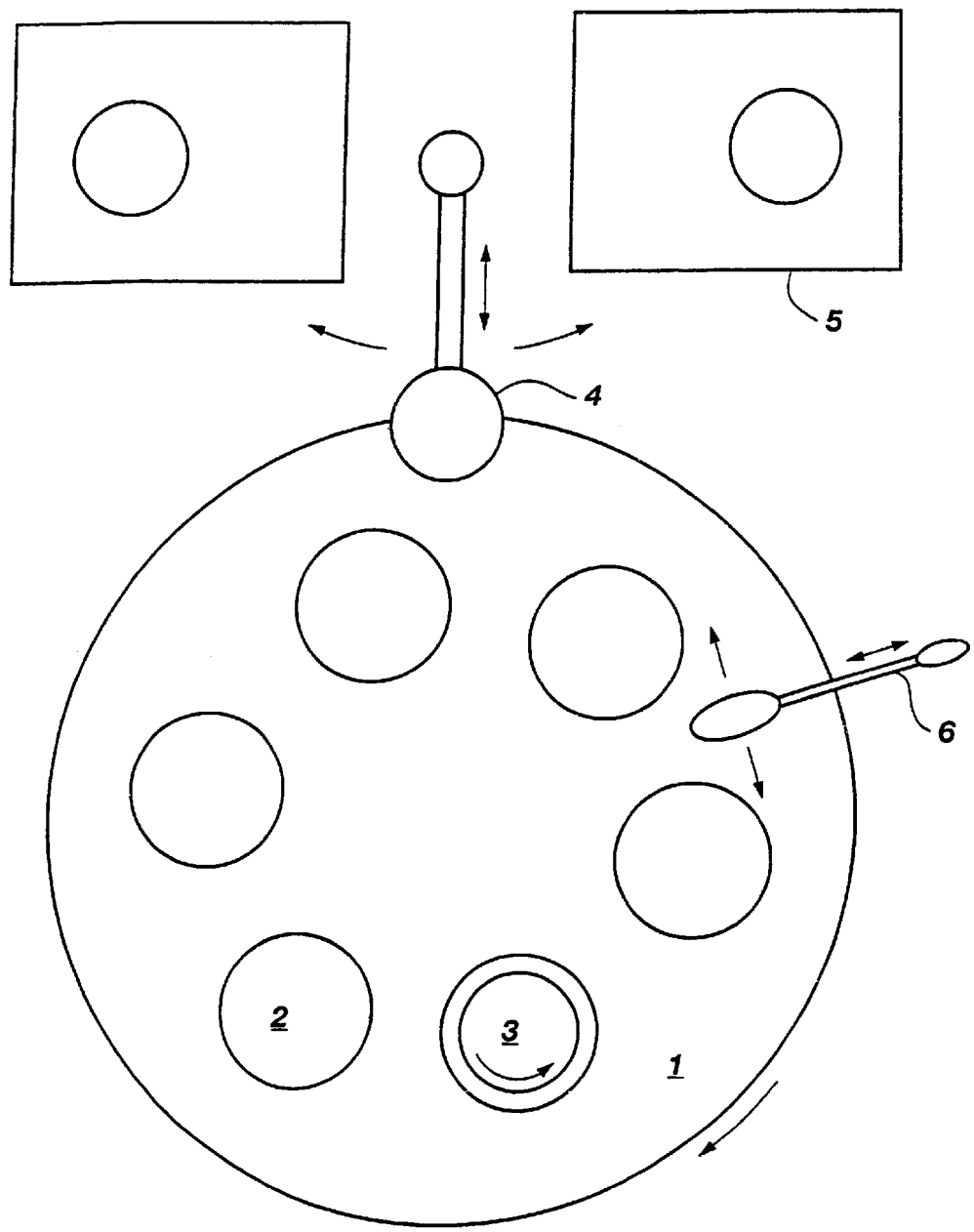
FIG. 3 is an illustration of a top view of a polishing table of a conventional rotational chemical mechanical planarization apparatus.
Figure 6:
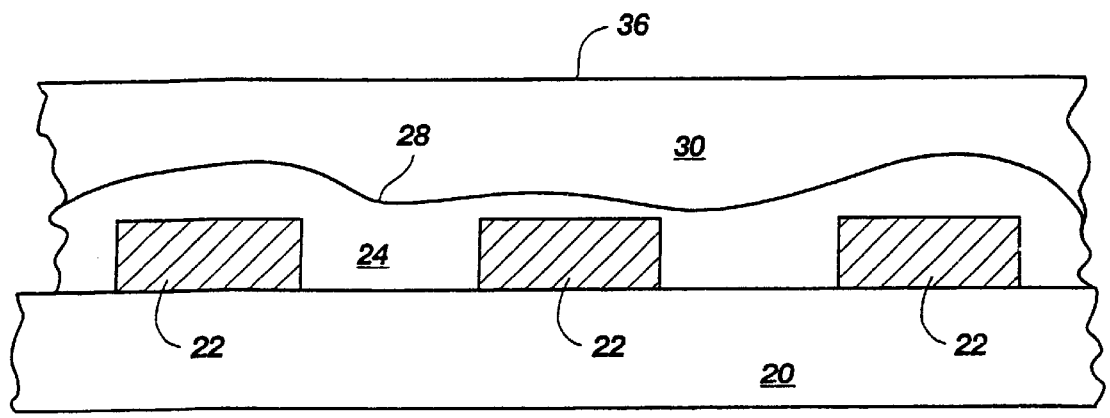
FIG. 6 is a cross-sectional view of a portion of a wafer substrate having electrical circuit components formed thereon, a coating thereover, and a deformable coating after the deformation thereof by the flat pressing member and flexible planar interface material and process of the present invention.

Referring to drawing FIG. 6, before the planarization process, either by a dry chemical etching process or a chemical mechanical planarization process of the insulating material 24 and deformable material 30 on the electrical circuit components 22 on the wafer substrate 20, commences, the wafer substrate 20 having electrical circuit components 22 and insulative material 24 thereon is illustrated having the deformable material 30 having a flat, planar surface 36 thereon providing a global flat, planar surface on the wafer substrate. As illustrated, the global surface 36 on the deformable material 30 is a flat, planar surface from which a planarization process is to begin on the wafer substrate 20. In this manner, a conventional well-known planarization process as described hereinbefore can be used to form flat, planar surfaces on the insulating material 24. By starting with a globally flat, planar surface 36 on the deformable material 30, any deformation of the polishing pad 17 (FIG. 2) is minimized if a chemical mechanical planarization process is used. Also, any nonuniform planarization which may occur due to the uneven distribution of the chemical reactive solution and abrasives included therein or material particles from the surfaces being planarized being collected or present in the polishing pad 17 resulting from surface irregularities is minimized. In this manner, by starting the chemical mechanical planarization process from a globally flat, planar surface 36 of the deformable material 30 as the chemical mechanical planarization process is carried out, the surfaces of the layers being planarized remain flat and planar because the polishing pad 17 is subjected to more uniform loading and operation during the process. This is in clear contrast to the use of a chemical mechanical planarization process beginning from an irregular nonplanar surface as is typically carried out in the prior art. Similarly, if a dry chemical etching planarization process is used, by starting the dry chemical etching process from a globally flat, planar surface 36 of the deformable material 30, the surfaces of the layers being planarized remain flat and planar because the chemical gases used in the dry etching process react at the same rate on the flat and planar global surfaces of the insulating material 24 and deformable material 30, thereby keeping the surfaces globally flat. This is in clear contrast to the use of a chemical dry etching process beginning from an irregular nonplanar surface as is typically carried out in the prior art.

Figure 7:
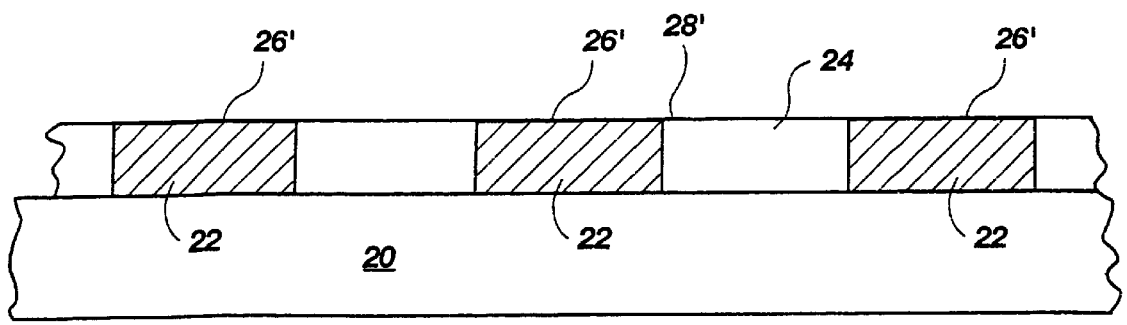
FIG. 7 is a cross-sectional view of a portion of a wafer substrate having electrical circuit components formed thereon and a coating material between the electrical circuit components after the planarization thereof.

Referring to drawing FIG. 7, illustrated is a wafer substrate 20, electrical circuit components 22 and insulating material 24, which have been planarized using the improved planarization process of the present invention. As illustrated, a flat, planar surface 28☐ been formed through the use of the planarization process using the object 32 and flexible planar. interface material 40 of the present invention as described hereinbefore with a subsequent planarization process, such as a chemical mechanical planarization process or a dry chemical etching process to form the flat planar surface 28☐ of the insulating material 24.

Figure 8A:
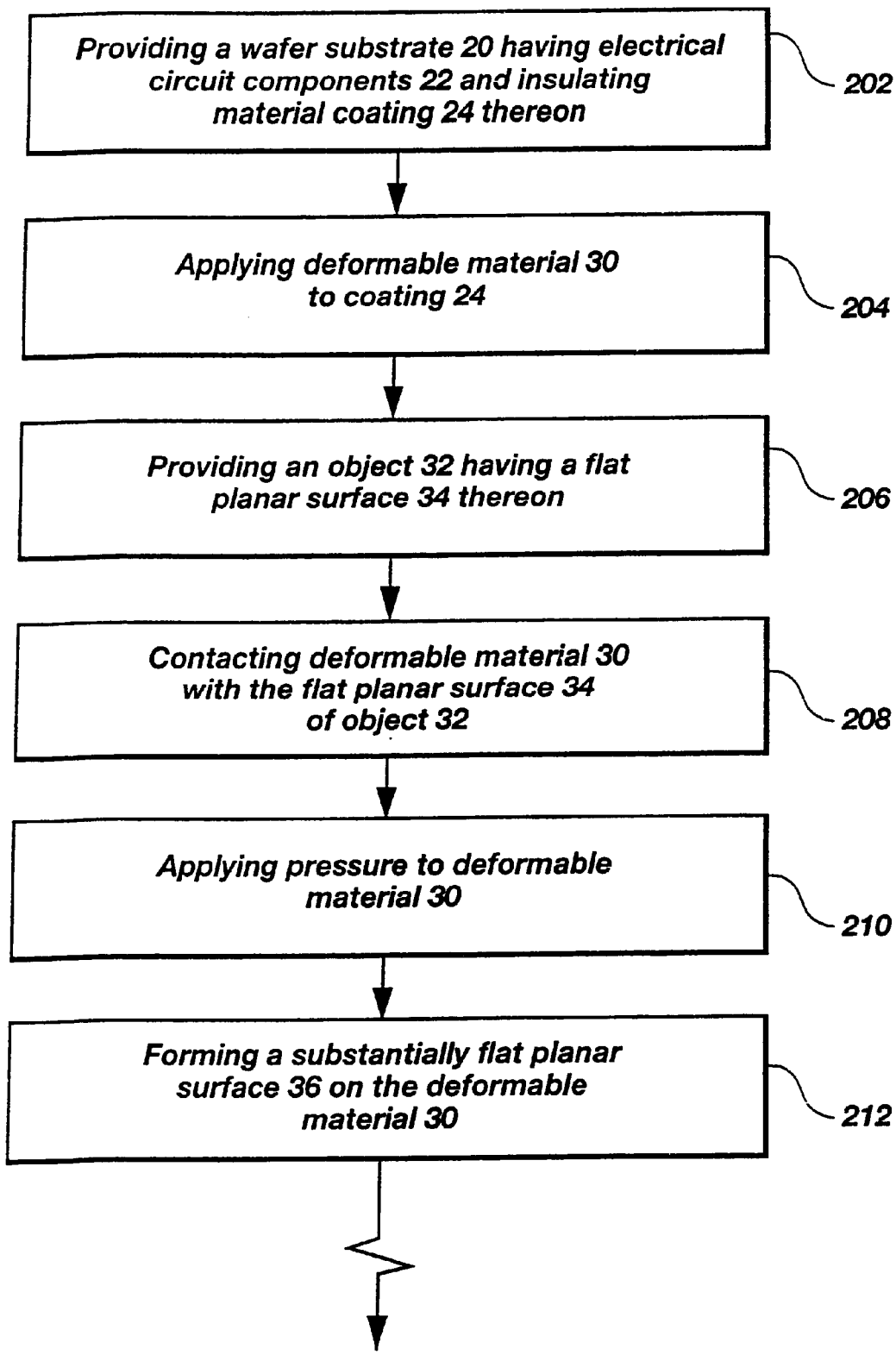
FIGS. 8A and 8B are a process flow description of the improved chemical mechanical planarization process of the present invention as illustrated in FIG. 7.
Figure 8B:
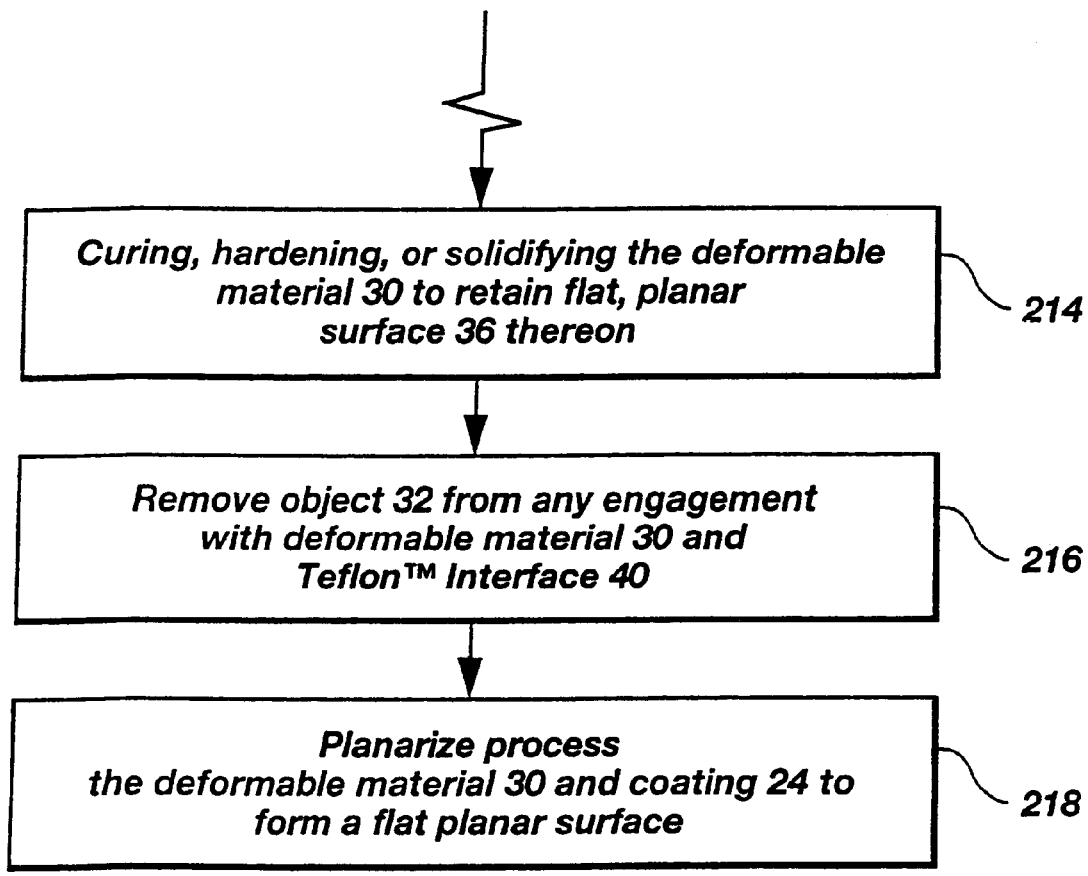

Referring to drawing FIGS. 8A and 8B, the improved chemical mechanical planarization process of the present invention as described hereinbefore is illustrated in a series of process steps 202 through 218.

In process step 202, a wafer substrate 20 is provided having electrical circuit components 22 formed thereon and an insulating material coating 24 covering the electrical circuit components 22 and portions of the wafer substrate 20.

In process step 204, a coating of deformable material 30 which is uncured, unhardened, or unsolidified at the time of application is applied to the coating of insulating material 24 to cover the same.

Next, in process step 206, an object 32 having a flat planar surface 34 thereon is provided for use.

In process step 208, the surface of the deformable material 30 and flexible interface material 40 is contacted by the flat, planar surface 34 of the object 32.

In process step 210, a predetermined level of pressure is applied at a predetermined temperature level to the deformable material 30. The pressure may be applied to either the object 32 having the flexible planar interface material 40 between the object 32 and substrate 20, the substrate 20, or both, etc.

In process step 212, flat, planar surface 34 of object 32 having flexible planar interface material 40 thereover forms a flat, planar surface 36 on the deformable material 30.

In process step 214, while the flat, planar surface of the flexible planar interface material 40 and the object 32 engages the deformable material 30 thereby forming the flat, planar surface 36 thereon, the deformable material 30 is cured, hardened, or solidified to cause the permanent formation and retention of the flat, planar surface 36 on the deformable material 30.

In process step 216, the object 32 and flexible planar interface material 40 are removed from engagement with the deformable material 30 after the curing, hardening or solidification thereof to retain the flat, planar surface 36 thereon by the application of a sudden application of fluid pressure, such as a burst of fluid pressure, to the space between the object 32 and flexible planar interface material 40. Subsequent to the removal of the flexible planar interface material 40 from the deformable material 30 of substrate 20, a vacuum may be applied to the space between the object 32 and flexible planar interface material 40 to cause the flexible planar interface material 40 to engage the flat planar surface 34 of object 32.

In process step 218, the wafer substrate 20 having electrical circuit components 22, insulating material coating 24, and cured, hardened, or solidified deformable material 30 thereon is subjected to a suitable planarization process until the upper surfaces 26☐ of the electrical circuit components and surface 28☐ of the insulating material 24 are a concurrent common flat, planar surface extending across the wafer substrate 20 (see FIG. 7).

In this manner, when the improved process of chemical mechanical planarization of the present invention is used, the resulting planarized surface on the wafer substrate is globally planar or more planar since the process started from a globally flat, planar surface and the chemical mechanical planarization process reaches a successful conclusion more quickly.

Alternately, the wafer substrate 20 having electrical circuit components 22, insulating material 24, and cured, hardened, or solidified deformable material 30 thereon is subjected to a suitable dry isotropical etching process in a suitable type plasma etcher until the upper surfaces 26☐ of the electrical circuit components 22 and surface 28☐ of the insulating material 24 are substantially a concurrent, common, flat, planar surface extending across the wafer substrate 20 (see FIG. 7).

Figure 1:
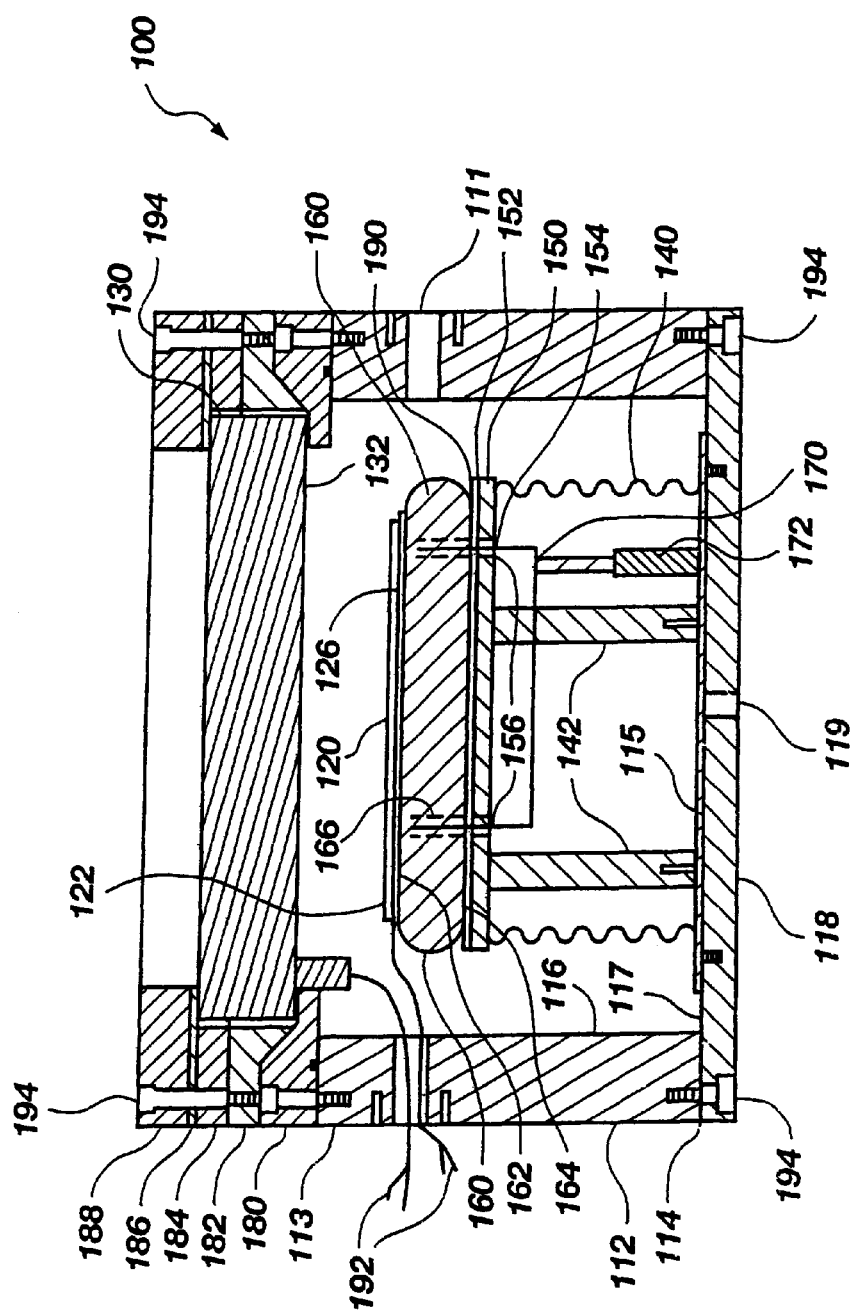
FIG. 1 is a side view of a conventional global planarization apparatus.
Figure 12:
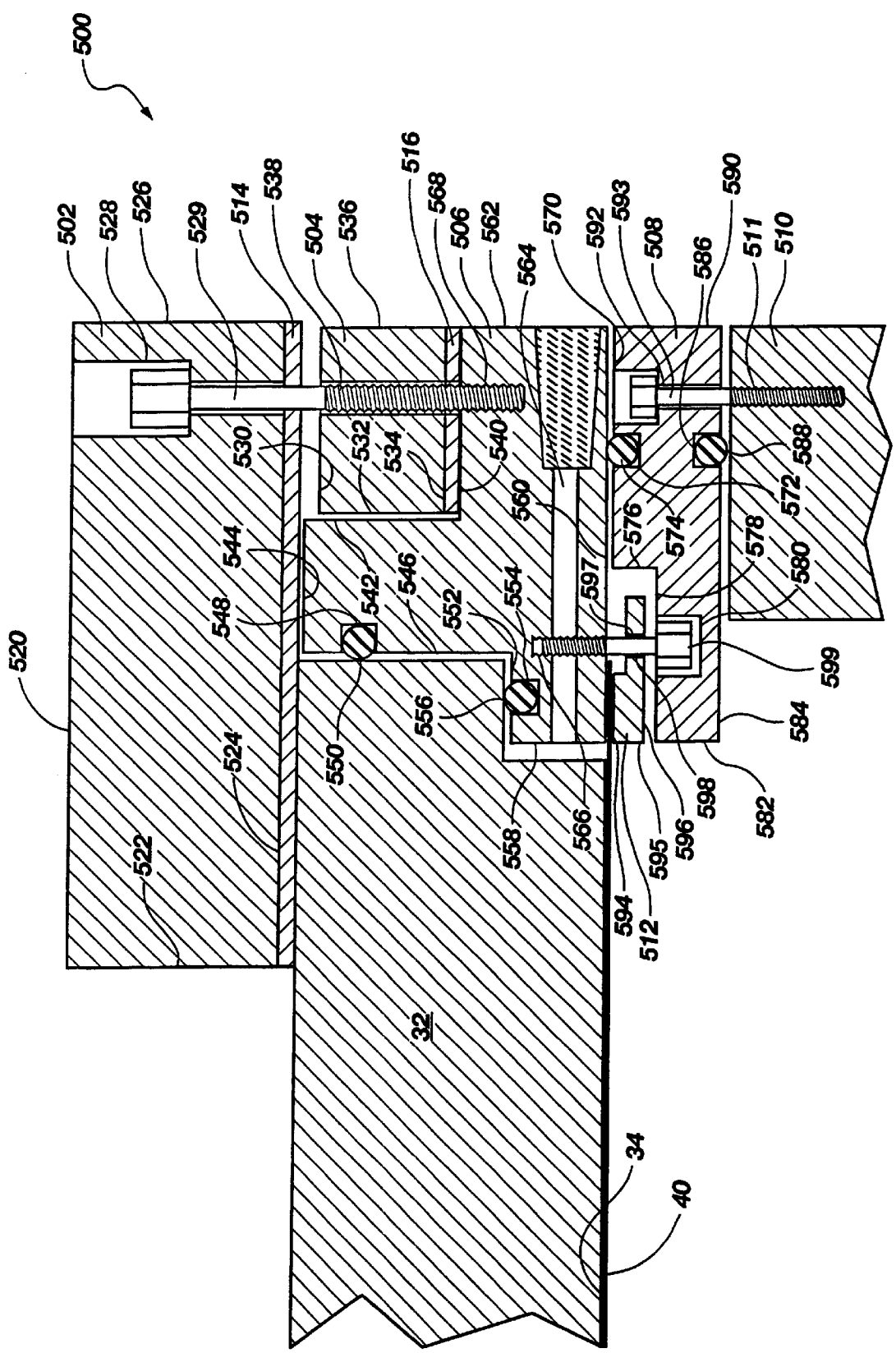
FIG. 12 is a quarter cross-sectional view of a third embodiment of a press lid assembly for a press of the present invention to be used in the method of the present invention.
Figure 13:
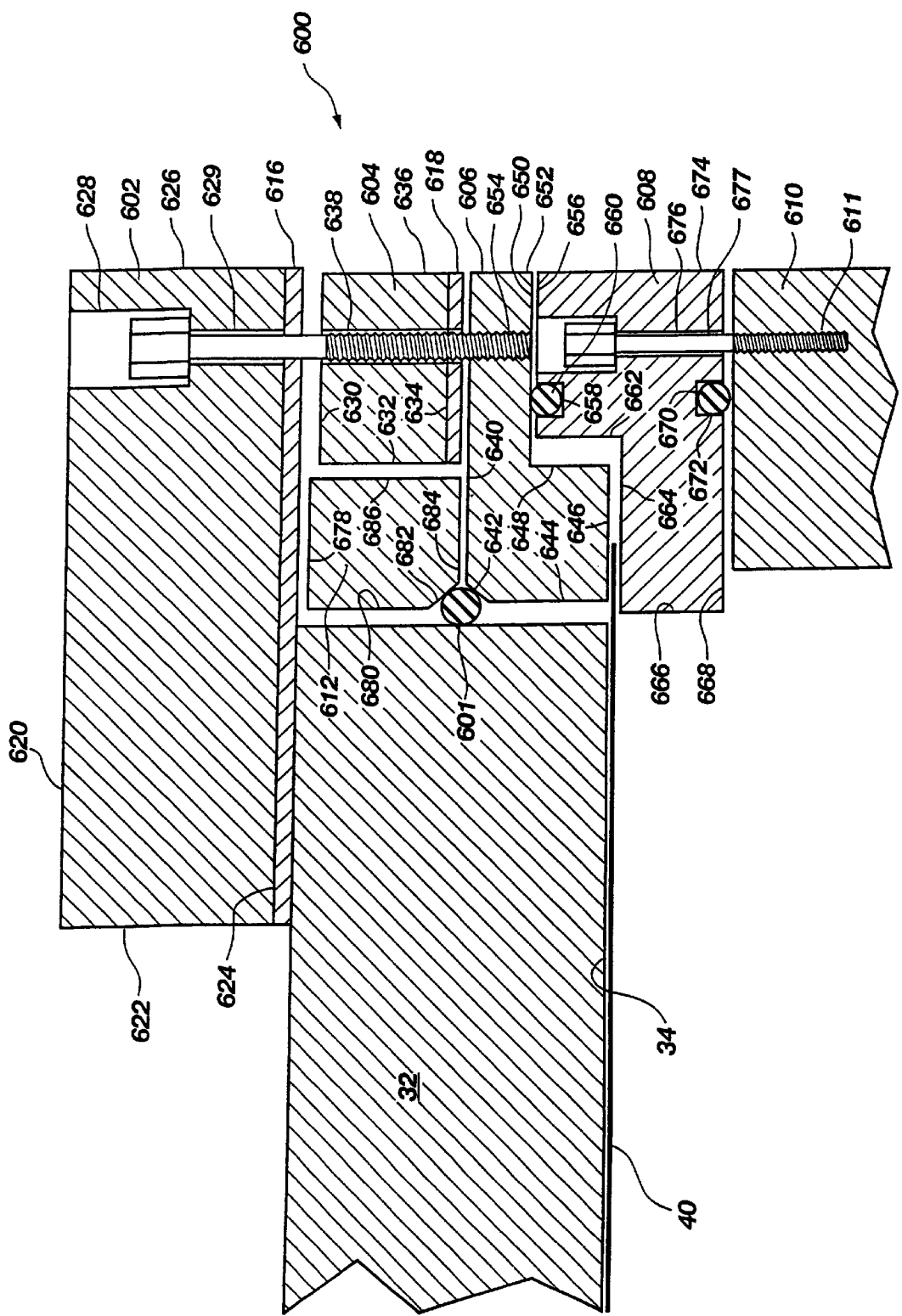
FIG. 13 is a quarter cross-sectional view of a fourth embodiment of a press lid assembly for a press of the present invention to be used in the method of the present invention.
Figure 14:
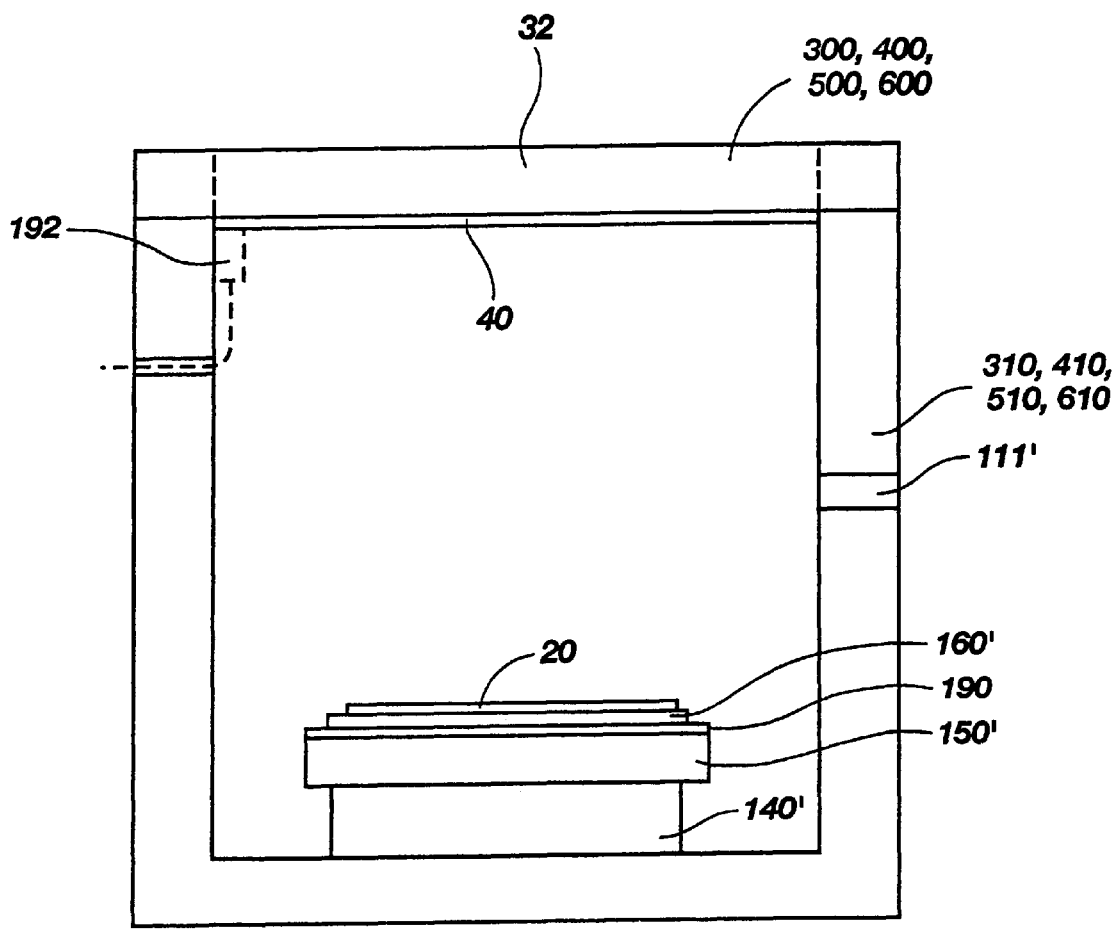
FIG. 14 is a cross-sectional view of the present invention installed in a chamber for planarizing a deformable surface on a wafer.

Referring to drawing FIGS. 9 through 13, the lid assemblies 300, 400, 500, and 600 may be used with an apparatus such as described in drawing FIGS. 1 and 14 for the planarization of a coating on the surface of a semiconductor wafer.

Figure 9:
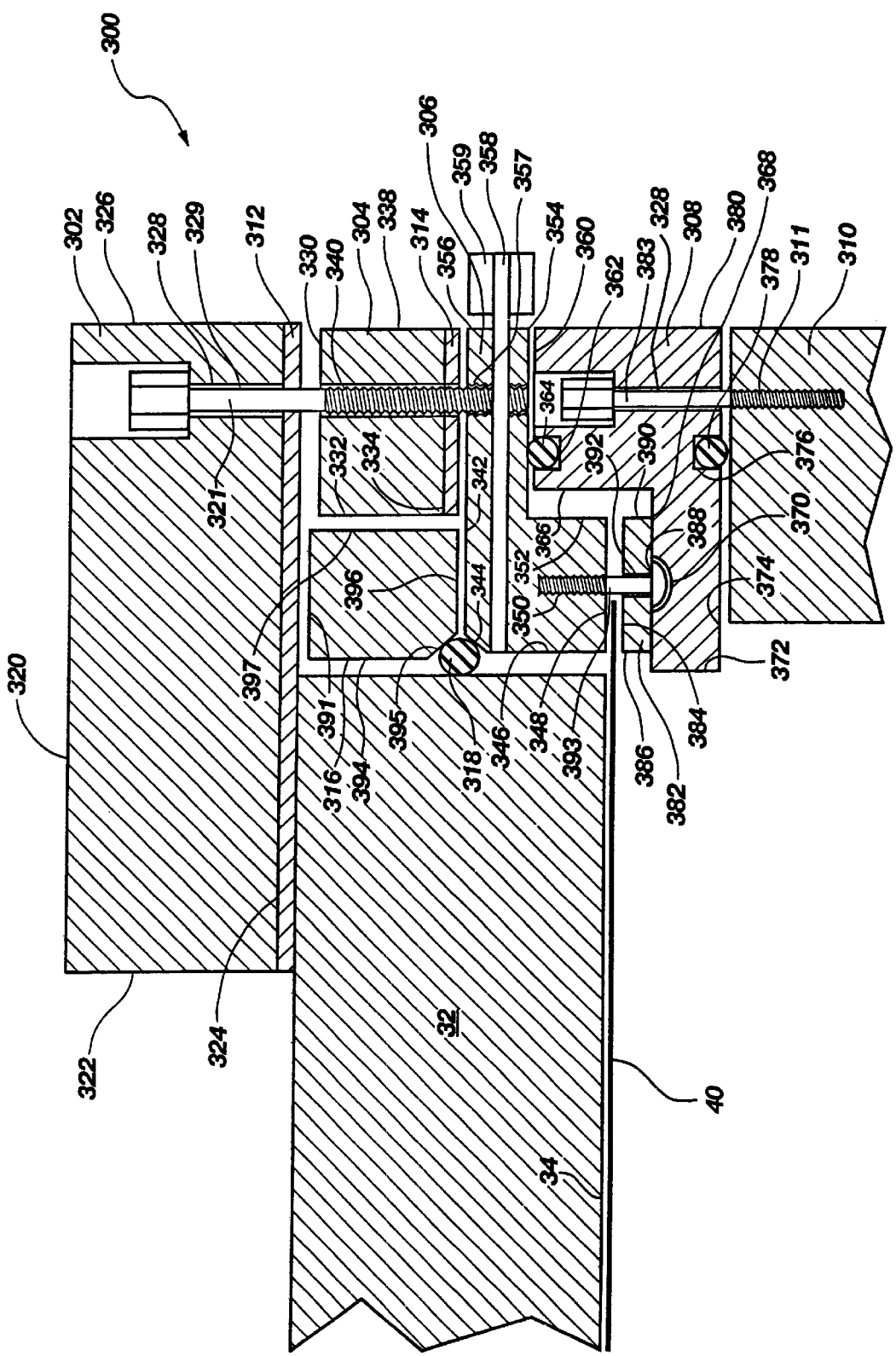
FIG. 9 is a quarter cross-sectional view of a first embodiment of a press lid assembly for a press of the present invention to be used in the method of the present invention.

Referring to drawing FIG. 9, a first embodiment of the present invention is illustrated. A wafer press lid assembly 300 is illustrated for use in the global planarization apparatus and process of the present invention. The lid assembly 300 comprises an upper lid 302, lid clamp 304, middle lid 306, lower lid 308, main chamber 310, object clamp 316, optical flat object 32, interface clamp 382, flexible planar interface material 40, upper annular seal 312 which sealingly engages upper surface 330 of lid clamp 304 and the lower surface 324 of upper lid 302, lower annular seal 314 which sealingly engages outer annular surface 356 of middle lid 306 and the lower surface 334 of lid clamp 304, and annular seal 318 sealingly engages the outer diameter of optical flat object 32 and the frustoconical annular surface 395 of object clamp 316. The annular seals 312 and 314 may be any suitable seal type material, such as annular Teflon™ material. The annular seal 318 may be any suitable type seal, such as an elastomeric o-ring type seal, a silicon o-ring type seal, etc.

The upper lid 302 comprises a generally cylindrical annular member having an upper surface 320, cylindrical inner surface 322, lower surface 324, cylindrical outer surface 326, and a plurality of apertures 328 therein which contain a plurality of threaded fasteners 329 extending therethrough to retain the upper lid 302 in position secured to the lid clamp 304.

The lid clamp 304 comprises a generally cylindrical annular member having an upper surface 330, inner cylindrical surface 332, lower surface 334, outer cylindrical surface 338, and a plurality of threaded apertures 340 therein, each aperture 340 receiving a portion of a threaded fastener 321 extending therein to retain the lid clamp 304 in position with respect to the upper lid 302.

The middle lid 306 comprises a generally cylindrically shaped annular member having an upper surface 342, frustoconical annular inner surface 344 which sealingly engages a portion of annular seal 318, inner cylindrical surface 346, first cylindrical annular surface 348 having a plurality of threaded blind apertures 350 therein, first vertical outer diameter surface 352, second cylindrical annular surface 354, and second vertical outer diameter surface 356. The middle lid 306 further includes at least one aperture 358, alternately a plurality of apertures, extending therethrough from the second vertical outer diameter surface 356 to the inner cylindrical surface 346 to allow a suitable gas or other fluid to flow therethrough, at least one aperture 358 having a suitable connector 359 connected thereto for connection to a supply of gas under pressure or fluid. The middle lid 306 further includes a plurality of threaded apertures 357 therein, each aperture 357 receiving and retaining a portion of threaded fastener 329 therein to retain the middle lid 306 to the upper lid 302.

The lower lid 308 comprises a generally annular cylindrical member having an upper surface 360 with an annular seal groove 362 therein having, in turn, annular o-ring seal 364 therein, first vertical inner cylindrical surface 366, inner annular surface 368 having a plurality of blind apertures 370 therein to provide clearance for the heads of threaded fasteners 393 therein, second vertical inner cylindrical surface 372, bottom or lower surface 374 having annular seal groove 376 therein having, in turn, annular o-ring seal 378 therein, and outer diameter cylindrical surface 380. The lower lid 308 further includes a plurality of apertures 328 therein extending from upper surface 360 to lower surface 374, each aperture containing a portion of a threaded fastener 383 therein to secure the lower lid 308 to the chamber 310. The annular seal grooves 362 and 376 contain a suitable annular o-ring type seal 364 and 378 therein, respectively, such as an elastomeric o-ring type seal, which sealingly engages the second annular cylindrical surface 354 and upper surface of chamber 310.

The interface clamp 382 comprises a generally cylindrical annular member having an upper surface 384, inner cylindrical surface 386, lower surface 388, and outer cylindrical diameter surface 390. The interface clamp 382 further includes a plurality of apertures 392 therein, each aperture having a portion of threaded fastener 393 extending therethrough to retain the interface clamp 382 connected to the middle lid 306 and to retain a portion of the flexible planar interface material 40 between the interface clamp 382 and the first cylindrical annular surface 348 of the middle lid 306.

The chamber 310 comprises any suitably shaped chamber capable of holding a substrate 20 therein for the planarization of the deformable coating 30 on the surface thereof using the optical flat object 32 and flexible planar interface material 40, such as a metal cylindrical annular chamber 310, having a plurality of threaded blind apertures 311 extending from the upper surface thereof into the wall of the chamber 310 to receive threaded portions of the threaded fasteners 383 therein to retain the lower lid 308 connected thereto when a vacuum is created in the chamber 310. The upper surface of the chamber 310 is suitable for the annular o-ring seal 378 of lower lid 308 to sealingly engage to form a suitable pressure and vacuum seal therewith. The chamber may include a thermocouple and a suitable heater therein, if desired.

The object clamp 316 comprises a generally annular cylindrical member having an upper surface 391, inner diameter vertical surface 394, frustoconical annular surface 395 which sealingly enagages a portion of annular seal 318, lower surface 396 which abuts a portion of upper surface 342 of middle lid 306, and outer diameter surface 397.

The flexible planar interface material 40 extends across the flat planar surface 34 of the optical flat object 32 by the interface clamp 382 retaining the flexible planar interface material 40 in the lid assembly 300. The flexible planar interface material 40 may be any suitable type material, such as a planar Teflon™ material, a synthetic resin polymer, etc., which allows the transmission of light therethrough which is used to cure, harden, or solidify the deformable material 30 on the insulating material 24 on the substrate 20. Alternately, the flexible planar interface material 40 may be any suitable type of material, such as planar Teflon™ material, a synthetic resin polymer, a flexible, planar thin metal material, etc., which does not need to allow for the transmission of light therethrough as the material forming the deformable material 30 hardens, cures, or solidifies. The flexible planar interface material 40 must have sufficient strength and thickness to resist any substantial thinning and/or stretching thereof during use, must have sufficient flexibility during use to conform to the surface of deformable material 30 and allow removal of the substrate 20 from the flexible planar interface material 40 after the planarization of the deformable material 30 and the removal of the flexible planar interface material 40 from the flat planar surface 34 of the object 32, and must not be subject to any wrinkling thereof during use, etc. For instance, when using a Teflon™ flexible planar interface material 40, the thickness of the Teflon™ flexible planar interface material 40 is preferred to be in the range of 0.040 inches thick to 0.005 inches thick for satisfactory use thereof. A thickness of 0.010 inches has been found to be effective and preferred for the use of a Teflon™ flexible planar interface material 40. If the thickness of the flexible planar interface material 40 is too great, the flexible planar interface material 40 will not flex sufficiently to allow ready removal of the substrate 20 from the flexible planar interface material 40 after the planarization of the deformable material 30 on the substrate 20 and will not allow for an effective planarization of the deformable material 30 on the substrate 20 as the flexible planar interface material 40 will locally deform and deflect. Alternately, if the flexible planar interface material 40 is too thin, the flexible planar interface material 40 will stretch, tear or rip when subjected to forces during planarization and during the application of fluid pressure thereto to remove the substrate 20 therefrom.

The optical flat object 32 may be any suitable type material, such as an optical grade glass flat or optical quality glass flat having a cylindrical shape to fit in the wafer press lid assembly 300 in sealing engagement therewith which allows the transmission of light therethrough which is used to cure, harden, or solidify the deformable material 30 on the insulating material 24 on the substrate 20. Alternately, if light transmission through the object 32 is not required, the object 32 may be of any suitable type material having the desired flat planar surface 34 thereon, such as ceramic material, stone material, or any material capable of having the desired flat surface thereon, etc.

To assist in removing the optical flat object 32 and the flexible planar interface material 40 from the surface of the deformable material 30 on the substrate 20 after the curing, hardening, or solidification thereof, a pressurized fluid, such as a suitable gas, is supplied through aperture(s) 358 in the middle lid 306 into the area between the optical flat object 32 and the flexible planar interface material 40 to separate the flexible planar interface material 40 from the flat planar surface 34 of the object 32 and, also, by the flexing of the flexible planar interface material 40 to separate the flexible planar interface material 40 from the flat planar surface 36 of the deformable material 30 to allow removal of the substrate 20 from the chamber 310. The pressurized fluid, such as a gas, may be any suitable gas supplied under pressure, such as compressed air, nitrogen, etc. If desired, a suitable liquid may be used rather than a gas, such as water, oil, etc., so long as the liquid may be readily removed from the area or space between the flat planar surface 34 of object 32 and the flexible planar interface material 40. When the pressurized fluid, such as a gas, is introduced between the flat planar surface 34 of object 32 and the flexible planar interface material 40, the pressurized fluid is introduced at a rate, such as in a burst of pressurized fluid, causing the rapid or very rapid flexing, or rippling, or bowing, or flexing, rippling, and bowing and/or movement of the flexible planar interface material 40 to cause the substrate 20 to quickly and suddenly release therefrom and to cause the flexible planar interface material 40 to quickly, suddenly release from the flat planar surface 34 of object 32. If desired, release agents may be used to enhance the release of the substrate 20 from the flexible planar interface material 40 and to enhance the release of the flexible planar interface material 40 from the flat planar surface 34 of object 32. The pressurized fluid, such as a gas, should not be introduced into the space between the flat planar surface 34 of object 32 and flexible planar interface material 40 at such a rate to cause the thinning or wrinkling of the flexible planar interface material 40 but, rather, to cause the flexing thereof. An effective manner to remove the substrate 20 from the flexible planar interface material 40 and the flexible planar interface material 40 from the flat planar surface 34 of object 32 is to supply pressurized fluid, such as a gas, into the space between the flat planar surface 34 of object 32 and the flexible planar interface material 40 in a burst to cause the substrate 20 to pop or be rapidly removed from the flexible planar interface material 40 and, subsequently, apply a vacuum to the space between the flat planar surface 34 of object 32 and the flexible planar interface material 40 to cause the flexible planar interface material 40 to adhere to the flat planar surface 34 of object 32.

Figure 10:
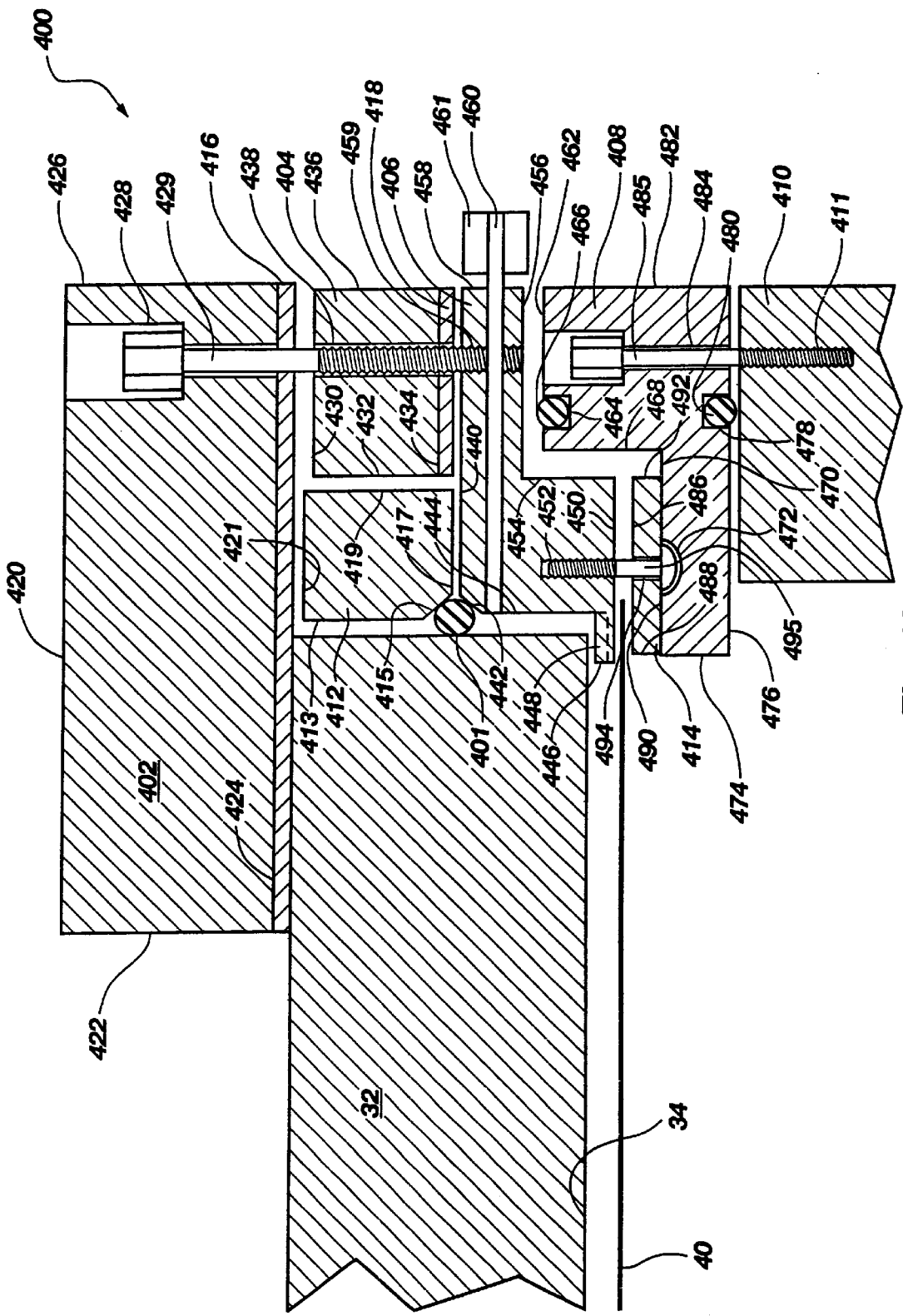
FIG. 10 is a quarter cross-sectional view of a second embodiment of a press lid assembly for a press of the present invention to be used in the method of the present invention.

Referring to drawing FIG. 10, a second embodiment, the preferred embodiment, of the present invention is illustrated. A wafer press lid assembly 400 comprises an upper lid 402, lid clamp 404, a middle lid 406, lower lid 408, chamber 410, object clamp 412, interface clamp 414, optical flat object 32, flexible planar interface material 40, annular seal 416 located between the lower surface 424 of upper lid 402 and the upper surface 430 of the lid clamp 404 and the upper surface 421 of object clamp 412, annular seal 418 located between the upper surface 440 of middle lid 406 and the lower surface 434 of lid clamp 404, and annular o-ring type seal 401 which sealingly engages the outer diameter of optical flat object 32. The annular o-ring seal 401 may be of any suitable material, such as described herein. The annular seal 416 and annular seal 418 may be of any suitable material as described herein.

The upper lid 402 comprises a generally cylindrical annular member having an upper surface 420, an inner diameter surface 422, a lower surface 424, and an outer diameter surface 426. The upper lid 402 further includes a plurality of apertures 428 therethrough, each aperture containing a portion of a threaded fastener 429 therein.

The lid clamp 404 comprises a generally cylindrical annular member having an upper surface 430, inner cylindrical surface 432, lower surface 434, outer cylindrical surface 436, and a plurality of apertures 438 therein, each aperture 438 receiving a portion of a threaded fastener 429 extending therethrough to retain the lid clamp 404 in position with respect to the upper lid 402.

The middle lid 406 comprises a generally cylindrically shaped annular member having an upper surface 440, frustoconical annular inner surface 442 which sealingly engages a portion of annular o-ring seal 401, inner cylindrical surface 444, annular cylindrical lip 446 having a plurality of radially extending grooves 448 therein, first cylindrical annular surface 450 having a plurality of threaded blind apertures 452 therein, first vertical outer diameter surface 454, second cylindrical annular surface 456, and second vertical outer diameter surface 458. The middle lid 406 further includes at least one aperture 460, alternately a plurality of apertures, extending therethrough from the second vertical outer diameter surface 458 to the inner cylindrical surface 444 to allow a suitable gas or other fluid to flow therethrough, at least one aperture 460 having a suitable connector 461 connected thereto for connection to a supply of gas under pressure or fluid. The middle lid 406 further includes a plurality of threaded apertures 459 therein, each aperture receiving a portion of threaded fastener 429 therein to retain the middle lid 406 to the upper lid 402.

The lower lid 408 comprises a generally annular cylindrical member having an upper surface 462 having an annular seal groove 464 therein having, in turn, annular o-ring seal 466 therein, first vertical inner cylindrical surface 468, inner annular surface 470 having a plurality of blind apertures 472 therein to provide clearance for the heads of threaded fasteners 495 therein, second vertical inner cylindrical surface 474, bottom or lower surface 476 having annular seal groove 478 therein having, in turn, annular o-ring seal 480 therein, and outer diameter cylindrical surface 482. The lower lid 408 further includes a plurality of apertures 484 therein extending from upper surface 462 to lower surface 476, each aperture 484 containing a portion of a threaded fastener 485 therein to secure the lower lid 408 to the chamber 410. The annular seal grooves 464 and 478 each contain a suitable annular o-ring type seal 466 and 480 therein, respectively, such as an elastomeric o-ring type seal, which sealingly engages the second cylindrical annular surface 456 and the upper surface of chamber 410.

The interface clamp 414 comprises a generally cylindrical annular member having an upper surface 486, inner cylindrical surface 488, lower surface 490, and outer cylindrical diameter 492. The interface clamp 414 further includes a plurality of apertures 494 therein, each aperture 494 having a portion of threaded fastener 495 extending therethrough to retain the interface clamp 414 connected to the middle lid 406 and to retain a portion of the flexible planar interface material 40 between the interface clamp 414 and the first cylindrical annular surface 450 of the middle lid 406.

The chamber 410 comprises any suitably shaped chamber capable of holding a substrate 20 therein for the planarization of the deformable material 30 on the surface thereof using the optical flat object 32 and flexible planar interface material 40, such as a metal cylindrical annular chamber 410 having a plurality of threaded blind apertures 411 extending from the upper surface thereof into the wall of the chamber 410 to receive threaded portions of the threaded fasteners 485 therein to retain the lower lid 408 connected thereto when a vacuum is created in the chamber 410. The upper surface of the chamber 410 is suitable for the annular o-ring seal 480 of lower lid 408 to sealingly engage to form a suitable pressure and vacuum seal therewith. The chamber may include a thermocouple and a heater therein, if desired.

The object clamp 412 comprises a generally annular cylindrical member having an upper surface 421, inner diameter vertical surface 413, frustoconical annular surface 415 which sealingly enagages a portion of annular o-ring seal 401, lower surface 417 which abuts a portion of upper surface 440 of middle lid 406, and outer diameter surface 419.

The flexible planar interface material 40 extends across the bottom surface 34 of the optical flat object 32 by the interface clamp 414 retaining the flexible planar interface material 40 in the wafer press lid assembly 400. The flexible planar interface material 40 may be any suitable type material, such as a planar Teflon™ material, a synthetic resin polymer, etc., which allows the transmission of light therethrough, which is used to cure, harden, or solidify the deformable material 30 on the insulating material 24 on the substrate 20. Alternately, the flexible planar interface material 40 may be of any type as described herein.

The optical flat object 32 may be any suitable type material, such as a cylindrical optical glass flat shaped to fit in the wafer press lid assembly 400 in sealing engagement therewith, which allows the transmission of light therethrough which is used to cure, harden, or solidify the deformable material 30 on the insulating material 24 on the substrate 20. Alternately, if light transmission through the object 32 is not required, the object 32 may be of any suitable type material having the desired flat planar surface 34 thereon, such as ceramic material, stone material, or any material capable of having the desired flat surface thereon, etc.

To assist in removing the optical flat object 32 and the flexible planar interface material 40 from the surface of the deformable material 30 on the substrate 20 after the curing, hardening, or solidification thereof, a pressurized fluid, such as a suitable gas, is supplied through apertures 460 in the middle lid 406 past annular o-ring seal 401 into the area between the optical flat object 32 and the flexible planar interface material 40 to separate the flexible planar interface material 40 from the flat planar surface 34 of the object 32 and, also, by the flexing of the flexible planar interface material 40 to separate the flexible planar interface material 40 from the flat planar surface 36 of the deformable material 30 to allow removal of the substrate 20 from the chamber 410. The pressurized fluid, such as a gas, may be any suitable gas supplied under pressure, such as compressed air, nitrogen, etc. If desired, a suitable liquid may be used rather than a gas, such as water, oil, etc., so long as the liquid may be readily removed from the area or space between the flat planar surface 34 of object 32 and the flexible planar interface material 40. The pressurized fluid, such as a suitable gas, is supplied through apertures 460 in the area between the optical flat object 32 and the flexible planar interface material 40 to separate the flexible planar interface material 40 from the flat planar surface 34 of the object 32 and the deformable material 30 of the substrate 20 with a vacuum being subsequently applied through apertures 460 to the space between the object 32 and flexible planar interface material 40 to return the flexible planar interface material 40 to the flat planar surface 34 of object 32. When the pressurized fluid, such as a gas, is introduced between the flat planar surface 34 of object 32 and the flexible planar interface material 40, the pressurized fluid is introduced at a rate, such as in a burst of pressurized fluid, causing the rapid or very rapid flexing, or rippling, or bowing, or flexing, rippling, and bowing and/or movement of the flexible planar interface material 40 to cause the substrate 20 to quickly and suddenly release therefrom and to cause the flexible planar interface material 40 to quickly, suddenly release from the flat planar surface 34 of object 32. If desired, release agents may be used to enhance the release of the substrate 20 from the flexible planar interface material 40 and to enhance the release of the substrate 20 from the flexible planar interface material 40 and to enhance the release of the flexible planar interface material 40 from the flat planar surface 34 of object 32. The pressurized fluid, such as a gas, should not be introduced into the space between the flat planar surface 34 of object 32 and the flexible planar interface material 40 at such a rate to cause the thinning or wrinkling of the flexible planar interface material 40 but, rather, cause the flexing thereof. An effective manner to remove the substrate 20 from the flexible planar interface material 40 and the flexible planar interface material 40 from the flat planar surface 34 of the object 32 is to supply pressurized fluid, such as a gas, into the space between the surface 34 of object 32 and the flexible planar interface material 40 in a burst to cause the substrate 20 to pop or be rapidly removed from the flexible planar interface material 40 and, subsequently, apply a vacuum to the space between the flat planar surface 34 of object 32 and the flexible planar interface material 40 to cause the interface material to adhere to the flat planar surface 34 of object 32.

Figure 11:
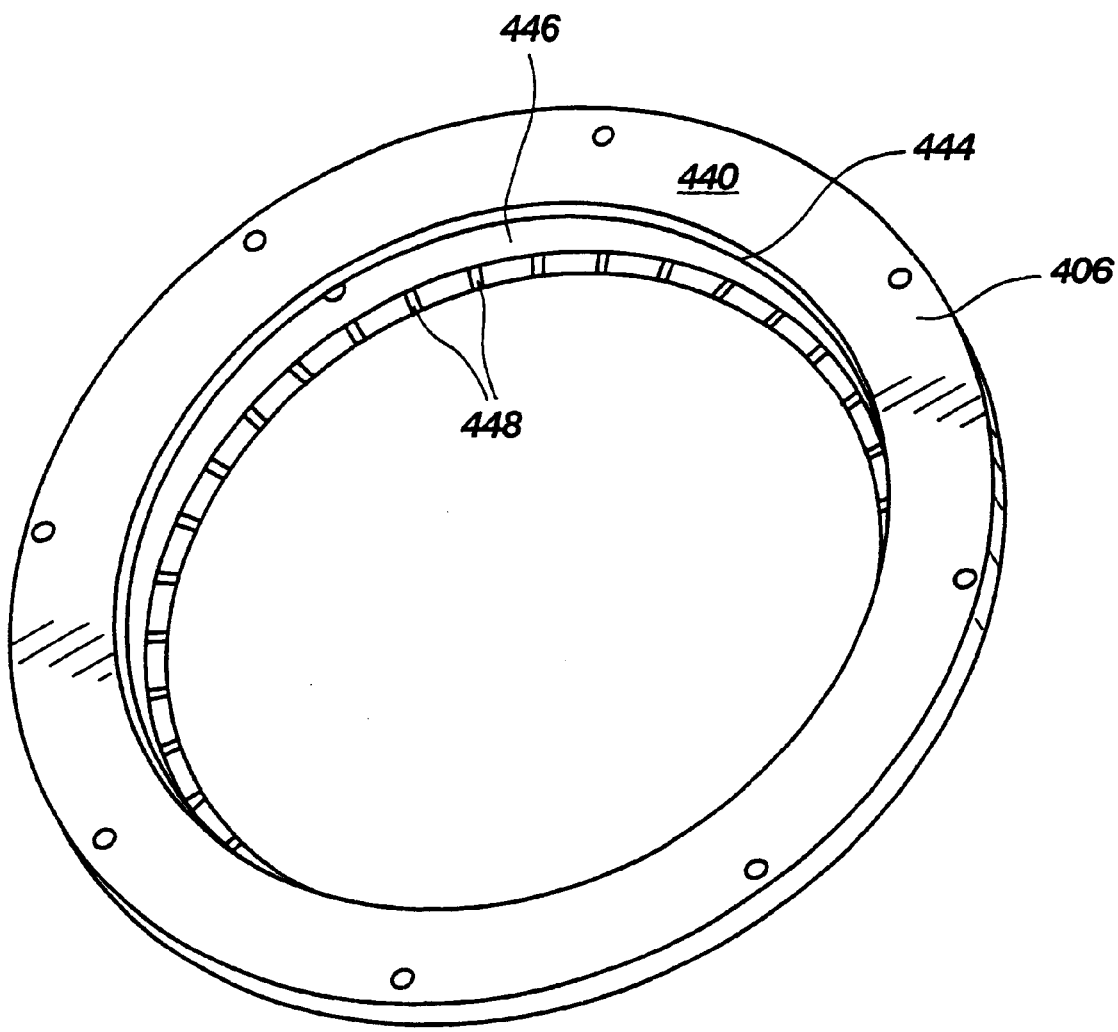
FIG. 11 is a perspective view of the middle lid for the press lid assembly illustrated in drawing FIG. 10.

Referring to drawing FIG. 11, the middle lid 406 is illustrated in a perspective view to show the radially extending grooves 448 in the annular cylindrical lip 446 for the suitable gas supplied through at least one aperture 460 thereto.

Referring to drawing FIG. 12, a third embodiment of the present invention is illustrated. The wafer press lid assembly 500 comprises an upper lid 502, lid clamp 504, a middle lid 506, lower lid 508, chamber 510, interface clamp 512, annular seal 514 sealingly engaging the lower surface 524 of upper lid 502 and the upper surface 544 of middle lid 506 and upper surface 530 of lid clamp 504, annular seal 516 sealingly engaging the lower surface 534 of lid clamp 504 and first upper surface 540 of middle lid 506, optical flat object 32, and flexible planar interface material 40. The annular seal 516 may be of any suitable material as described hereinbefore.

The upper lid 502 comprises a generally cylindrical annular member having an upper surface 520, inner diameter surface 522, lower surface 524, and outer diameter surface 526. The upper lid 502 further includes a plurality of apertures 528, each aperture 528 having a portion of a threaded fastener 529 extending therethrough.

The lid clamp 504 comprises a generally cylindrical annular member having an upper surface 530, inner cylindrical surface 532, lower surface 534, outer cylindrical surface 536, and a plurality of apertures 538 therein, each aperture 538 receiving a portion of a threaded fastener 529 extending therethrough to retain the lid clamp 504 in position with respect to the upper lid 502.

The middle lid 506 comprises a generally cylindrical annular member having a first upper surface 540, vertical cylindrical surface 542, second upper surface 544, first inner diameter vertical surface 546 having annular seal groove 548 therein, which has, in turn, annular o-ring seal 550 therein, sealingly engaging a surface of the optical flat object 32, annular cylindrical surface 552 having annular seal groove 554 therein having, in turn, annular o-ring seal 556 therein sealingly engaging a surface of the optical flat object 32, second inner diameter vertical surface 558, bottom or lower surface 560, and outer diameter surface 562. The middle lid 506 further includes at least one aperture 564 extending from the outer diameter surface 562 to the second inner diameter vertical surface 558 for the supply of a suitable gas therethrough, the outer portion of at least one aperture 564 being threaded for the connection of a suitable supply of pressurized fluid, such as a gas under pressure, thereto or other suitable fluid, a plurality of threaded apertures 566, each threaded aperture 566 receiving a portion of threaded fastener 599 therein, and a plurality of threaded apertures 568 in first upper surface 540, each aperture 568 threadedly receiving a portion of threaded fastener 529 therein.

The lower lid 508 comprises a generally annular cylindrical member having an upper surface 570 having an annular seal groove 572 therein having, in turn, annular o-ring seal 574 therein, first vertical inner cylindrical surface 576, inner annular surface 578 having a plurality of blind apertures 580 therein to provide clearance for the heads of threaded fasteners 599 therein, second vertical inner cylindrical surface 582, lower surface 584 having annular seal groove 586 therein having, in turn, annular o-ring seal 588 therein, and outer diameter cylindrical surface 590. The lower lid 508 further includes a plurality of apertures 592 therein extending from upper surface 570 to lower surface 584, each aperture 592 containing a portion of a threaded fastener 593 therein to secure the lower lid 508 to the chamber 510. The annular seal grooves 572 and 586 each contain a suitable annular o-ring type seal 574 and 588 therein, respectively, such as an elastomeric o-ring type seal, which sealingly engages lower surface 560 of the middle lid 506 and the upper surface of the chamber 510.

The interface clamp 512 comprises a generally cylindrical annular member having an upper surface 594, inner diameter surface 595, lower surface 596, and inner annular extending lip 597 having a plurality of apertures 598 therein, each aperture having a portion of threaded fastener 599 extending therethrough engaging a blind threaded aperture 566 in the middle lid 506 to secure the interface clamp 512 thereto and to retain a portion of the flexible planar interface material 40 secured between the interface clamp 512 and the lower surface 560 of the middle lid 506.

The chamber 510 comprises any suitably shaped chamber capable of holding a substrate 20 therein for the planarization of the deformable material 30 on the surface thereof using the optical flat object 32 and flexible planar interface material 40, such as a metal cylindrical annular chamber 510 having a plurality of threaded blind apertures 511 extending from the upper surface thereof into the wall of the chamber 510 to receive threaded portions of the threaded fasteners 593 therein to retain the lower lid 508 connected thereto when a vacuum is created in the chamber 510. The upper surface of the chamber 510 is suitable for the annular o-ring seal 588 of lower lid 508 to sealingly engage to form a suitable pressure and vacuum seal therewith. The chamber may include a thermocouple and heater therein, if desired.

The flexible planar interface material 40 extends across the flat planar surface 34 of the optical flat object 32 by the interface clamp 512 retaining the flexible planar interface material 40 in the lid assembly 500. The flexible planar interface material 40 may be any suitable type material, such as a planar Teflon™ material, a synthetic resin polymer, etc., which allows the transmission of light therethrough which is used to cure, harden, or solidify the deformable material 30 on the insulating material 24 on the substrate 20. Alternately, the flexible planar interface material 40 may be of any suitable type material and thickness as described herein, such as planar Teflon™ material, a synthetic resin polymer, a flexible planar thin metal material, etc., which does not need to allow for the transmission of light therethrough as the material forming the deformable material 30 hardens, cures, or solidifies. The flexible planar interface material 40 must have sufficient strength and thickness to resist any substantial thinning and/or stretching thereof during use, must have sufficient flexibility during use to conform to the surface of deformable material 30 and allow removal of the substrate 20 from the flexible planar interface material 40 after the planarization of the deformable material 30 and the removal of the flexible planar interface material 40 from the flat planar surface 34 of the object 32, and must not be subject to any wrinkling thereof during use, etc. For instance, when using a Teflon™ flexible planar interface material 40, the thickness of the Teflon™ flexible planar interface material is preferred to be in the range of 0.040 inches thick to 0.005 inches thick for satisfactory use thereof. A thickness of 0.010 inches is preferred for the use of a Teflon™ flexible interface material 40. If the thickness of the flexible planar interface material 40 is too great, the flexible planar interface material 40 will not flex sufficiently to allow ready removal of the substrate 20 from the flexible planar interface material 40 after the planarization of the deformable material 30 on the substrate 20 and will not allow for an effective planarization of the deformable material 30 on the substrate 20 as the flexible planar interface material 40 will locally deform and deflect. Alternately, if the flexible planar interface material 40 is too thin, the flexible planar interface material 40 will stretch, tear or rip when subjected to forces during planarization and during the application of fluid pressure thereto to remove the substrate 20 therefrom.

The optical flat object 32 may be any suitable type material, such as a cylindrical optical glass flat shaped to fit in the wafer press lid assembly 500 in sealing engagement therewith, which allows the transmission of light therethrough which is used to cure, harden, or solidify the deformable material 30 on the insulating material 24 on the substrate 20. Alternately, if light transmission through the object 32 is not required, the flat object 32 may be of any suitable material as described herein having the desired flat planar surface 34 thereon, such as ceramic material, stone material, or any material capable of having the desired flat surface thereon, etc.

To assist in removing the optical flat object 32 and the flexible planar interface material 40 from the surface of the deformable material 30 on the substrate 20 after the curing, hardening, or solidification thereof, a pressurized fluid, such as a suitable gas, is supplied through at least one aperture 564 in the middle lid 506 into the area between the optical flat object 32 and the flexible planar interface material 40 to separate the flexible planar interface material 40 from the flat planar surface 34 of the object 32 and, also, by the flexing of the flexible planar interface material 40 to separate the flexible planar interface material 40 from the flat planar surface 36 of the deformable material 30 to allow removal of the substrate 20 from the chamber 510. The pressurized fluid, such as a gas, may be any suitable gas supplied under pressure, such as compressed air, nitrogen, etc. If desired, a suitable liquid may be used rather than a gas, such as water, oil, etc., so long as the liquid may be readily removed from the area or space between the flat planar surface 34 of object 32 and the flexible planar interface material 40. When the pressurized fluid, such as a gas, is introduced between the flat planar surface 34 of object 32 and the flexible planar interface material 40, the pressurized fluid is introduced at a rate, such as in a burst of pressurized fluid, causing the rapid or very rapid flexing, or rippling, or bowing, or flexing, rippling and bowing and/or movement of the flexible planar interface material 40 to suddenly release the flat planar surface 34 of object 32. If desired, release agents may be used to enhance the release of the substrate 20 from the flexible planar interface material 40 and to enhance the release of the flexible planar interface material 40 from the flat planar surface 34 of object 32. The pressurized fluid, such as a gas, should not be introduced into the space between the flat planar surface 34 of object 32 and flexible planar interface material 40 at such a rate to cause the thinning or wrinkling of the flexible planar interface material 40 but, rather, cause the flexing thereof. An effective manner to remove the substrate 20 from the flexible planar interface material 40 and the flexible planar interface material 40 from the flat planar surface 34 of object 32 is to supply pressurized fluid, such as a gas, into the space between the flat planar surface 34 of object 32 and the flexible planar interface material 40 in a burst to cause the substrate to pop or be rapidly removed from the flexible planar interface material 40 and, subsequently, apply a vacuum to the space between the flat planar surface 34 of object 32 and the flexible planar interface material 40 to cause the flexible planar interface material 40 to adhere to the flat planar surface 34 of object 32.

Referring to drawing FIG. 13, a fourth embodiment of the present invention is illustrated. A wafer press lid assembly 600 comprises an upper lid 602, lid clamp 604, a middle lid 606, lower lid 608, chamber 610, object clamp 612, flexible planar interface material 40, annular seal 616 located between the lower surface 624 of upper lid 602 and the upper surface 630 of the lid clamp 604 and the upper surface 678 of object clamp 612, annular seal 618 located between the upper surface 640 of middle lid 606 and the lower surface 634 of lid clamp 604, and annular o-ring type seal 601 which sealingly engages the outer diameter surface of optical flat object 32, frustoconical annular inner surface 682 of object clamp 612, and frustoconical annular surface 642 of middle lid 606. The annular o-ring seal 601 may be of any suitable material, such as described herein. The annular seal 616 and annular seal 618 may be of any suitable material as described herein.

The upper lid 602 comprises a generally cylindrical annular member having an upper surface 620, an inner diameter surface 622, a lower surface 624, and an outer diameter surface 626. The upper lid 602 further includes a plurality of apertures 628 therethrough, each aperture 628 containing a portion of a threaded fastener 629 therein.

The lid clamp 604 comprises a generally cylindrical annular member having an upper surface 630, inner cylindrical surface 632, lower surface 634, outer cylindrical surface 636, and a plurality of apertures 638 therein, each aperture 638 receiving a portion of a threaded fastener 629 extending therethrough to retain the lid clamp 604 in position with respect to the upper lid 602.

The middle lid 606 comprises a generally cylindrically shaped annular member having an upper surface 640, frustoconical annular inner surface 642 which sealingly engages a portion of annular o-ring type seal 601, inner cylindrical surface 644, first lower surface 646, first vertical outer diameter surface 648, second lower surface 650, and outer diameter surface 652. The middle lid 606 further includes a plurality of threaded apertures 654 extending therethrough from the upper surface 640 to the second lower surface 650, each aperture 654 threadedly receiving a portion of threaded fastener 629 therein to retain the middle lid 606 to the lid clamp 604.

The lower lid 608 comprises a generally annular cylindrical member having a first upper surface 656 having an annular seal groove 658 therein and having, in turn, annular o-ring seal 660 therein, first vertical inner cylindrical surface 662, inner annular surface 664, second vertical inner cylindrical diameter surface 666, bottom surface 668 having annular seal groove 670 therein having, in turn, annular o-ring seal 672 therein, and outer diameter cylindrical surface 674. The lower lid 608 further includes a plurality of apertures 676 therein extending from first upper surface 656 to bottom surface 668, each aperture 676 containing a portion of a threaded fastener 677 therein to secure the lower lid 608 to the chamber 610. The annular seal grooves 658 and 670 each contain a suitable annular o-ring type seal 660 and 672 therein, respectively, such as an elastomeric o-ring type seal, which sealingly engages the second lower surface 650 of middle lid 606 and the upper surface of chamber 610.

The chamber 610 comprises any suitably shaped chamber capable of holding a substrate 20 therein for the planarization of the deformable material 30 on the surface thereof using the optical flat object 32 and flexible planar interface material 40, such as a metal cylindrical annular chamber 610 having a plurality of threaded blind apertures 611 extending from the upper surface thereof into the wall of the chamber 610 to receive threaded portions of the threaded fasteners 677 therein to retain the lower lid 608 connected thereto when a vacuum is created in the chamber 610. The upper surface of the chamber 610 is suitable for the annular o-ring seal 672 of lower lid 608 to sealingly engage to form a suitable pressure and vacuum seal therewith. The chamber may include a thermocouple and a heater therein, if desired.

The object clamp 612 comprises a generally annular cylindrical member having an upper surface 678, inner diameter vertical surface 680, frustoconical annular surface 682 which sealingly enagages a portion of annular o-ring type seal 601, lower surface 684 which abuts a portion of upper surface 640 of middle lid 606, and outer diameter surface 686.

The flexible planar interface material 40 extends across the flat planar surface 34 of the optical flat object 32 by middle lid 606 and the lower lid 608 retaining the flexible planar interface material 40 in the wafer press lid assembly 600. The flexible planar interface material 40 may be any suitable type material, such as a planar Teflon™ material, a synthetic resin polymer, etc., which allows the transmission of light therethrough which is used to cure, harden, or solidify the deformable material 30 on the insulating material 24 on the substrate 20. The flexible planar interface material 40 is retained in the wafer press lid assembly 600 below the object 32 by the first lower surface 646 of the middle lid 606 and the inner annular surface 664 of the lower lid 608.

The optical flat object 32 may be any suitable type material, such as a cylindrical optical glass flat shaped to fit in the wafer press lid assembly 600 in sealing engagement therewith, which allows the transmission of light therethrough which is used to cure, harden, or solidify the deformable material 30 on the insulating material 24 on the substrate 20.

To remove the flexible planar interface material 40 from the surface of the optical flat object 32 after the curing, hardening, or solidification of the deformable material 30 on the substrate 20, the flexible planar interface material 40 is pulled away or peeled from the deformable material 30 and peeled or pulled away from the flat planar surface 34 of the object 32. A new piece of flexible planar interface material 40 is installed in the assembly 600 for use with another substrate 20 having a deformable material 30 thereon.

Referring to drawing FIG. 14, the present invention is shown with a chamber for the planarization of a deformable surface, such as surface 36 of deformable material 30 on a wafer substrate 20 illustrated in drawing FIGS. 4 through 7. A chamber 310, 410, 510, 610, as described hereinbefore, is used with a wafer press lid assembly 300, 400, 500, 600, as described hereinbefore, to planarize a deformable surface of flat object 32 on a wafer substrate 20. A flexible planar interface material 40 is used between the optical flat object 32 in the lid assembly and the wafer substrate 20. The wafer substrate 20 is placed on a wafer support 150☐ on a lifting apparatus 140☐, such as described hereinbefore, for the planarization process of deformable surface 36 of flat object 32 on wafer substrate 20. A flexible pressing member 160☐ may be included below the wafer substrate 20 on the wafer support 150☐. The chamber is subjected to a vacuum using aperture evacuation port 111☐ therein. A thermocouple 192 may be included to sense the temperature generated by heating element 190 within the chamber.

It will be understood that changes, additions, modifications, and deletions may be made to the improved chemical mechanical planarization process of the present invention, which are clearly within the scope of the claimed invention.

What is claimed is:

1. A method for planarizing a nonplanar film surface of a wafer comprising:
   securing an interface material relative to the wafer;
   contacting the nonplanar film surface of the wafer with the interface material; and
   forming a substantially flat planar surface on the nonplanar film surface of the wafer.

2. The method of claim 1, further comprising:
   planarizing the wafer using a planarization process.

3. The method of claim 1, further comprising:
   applying a fluid under pressure to one side of the interface material.

4. The method of claim 1, wherein the forming the substantially flat planar surface includes:
   coating the nonplanar film surface of the wafer with a deformable material.

5. The method of claim 4, further comprising:
   contacting the deformable material with the interface material.

6. The method of claim 5, further comprising:
   contacting the interface material with an object.

7. The method of claim 6, further comprising:
   applying a fluid under pressure between the interface material and the object.

8. The method of claim 5, further comprising:
   curing the deformable material while the interface material is contacting the deformable material.

9. The method of claim 5, further comprising:
   hardening the deformable material while the interface material is contacting the deformable material.

10. The method of claim 5, further comprising:
    solidifying the deformable material while the interface material is contacting the deformable material.

11. The method of claim 5, further comprising:
    applying pressure to the interface material contacting the deformable material while the interface material contacts the deformable material.

12. The method of claim 5, further comprising:
    applying pressure to the coating of the deformable material on the nonplanar film surface of the wafer while the interface material contacts the deformable material.

13. The method of claim 5, wherein the interface material includes a substantially flat planar surface thereon contacting the deformable material.

14. The method of claim 6, wherein the object includes a shaped surface thereon contacting the deformable material.

15. The method of claim 14, wherein the shaped surface includes a convex surface portion.

16. The method of claim 14, wherein the shaped surface includes a concave surface portion.

17. The method of claim 14, wherein the shaped surface includes a convex surface portion and a concave surface portion.

18. The method of claim 6, wherein the object includes a flat optical glass object.

19. The method of claim 5, further including:
    coating the interface material with a release agent prior to the contacting the deformable material.

20. The method of claim 6, further including:
    coating the object with a release agent prior to the contacting the interface material.

21. The method of claim 6, wherein the object includes a substantially inflexible object having a flat surface thereon.

22. The method of claim 4, further comprising:
    contacting the interface material with a member.

23. The method of claim 22, further comprising:
    applying a fluid under pressure to the interface material and to the member.

24. The method of claim 21, wherein a back of the wafer is contacted with a flexible resilient member.

25. The method of claim 24, further comprising:
    applying pressure to the flexible resilient member to form a substantially flat planar surface on the deformable material.

26. The method of claim 24, further comprising:
    contacting the flexible resilient member with a substrate; and
    applying pressure to the substrate thereby applying pressure to the flexible resilient member.

27. The method of claim 24, further comprising:
applying pressure to the wafer through the flexible resilient member thereby applying pressure to the object thereby deforming the coating of the deformable material on the wafer.

28. The method of claim 1, wherein the wafer includes a wafer having a plurality of electrical circuit components on a surface thereof.

29. The method of claim 1, wherein the wafer includes a wafer having a plurality of electrical circuit components on a surface thereof and a coating substantially covering the plurality of electrical circuit components.

30. The method of claim 1, wherein the wafer includes a wafer having a plurality of electrical circuit components on a surface thereof and a coating substantially covering the plurality of electrical circuit components and the wafer.

31. The method of claim 5, further comprising:
applying pressure to the interface material while the interface material contacts the deformable material.

32. The method of claim 6, further comprising:
applying a substantially uniform pressure to the object while the object is in contact with the interface material.

33. The method of claim 5, further comprising:
applying a substantially uniform pressure to the deformable material on the nonplanar film surface of the wafer to form a substantially flat planar surface on the deformable material.

34. The method of claim 2, wherein the planarization process includes a chemical mechanical planarization process.

35. The method of claim 2, wherein the planarization process includes a chemical etching process.

36. The method of claim 3, further comprising:
applying a vacuum to the interface material.

37. A method for planarizing a nonplanar film surface of a wafer having at least one electrical circuit formed thereon comprising:
securing an interface material in a position relative to the nonplanar film surface of the wafer;
forming a substantially flat planar surface on the nonplanar film surface of the wafer; and
planarizing the substantially flat planar surface on the wafer using a planarization process.

38. The method of claim 37, further comprising:
applying a fluid under pressure to the interface material.

39. The method of claim 37, further comprising:
applying a vacuum to the interface material.

40. The method of claim 37, wherein the planarization process includes a chemical mechanical planarization process.

41. The method of claim 37, wherein the planarization process includes an etching process.

42. The method of claim 37, wherein the forming the substantially flat planar surface includes:
coating the nonplanar film surface of the wafer with a deformable material.

43. The method of claim 42, further comprising:
contacting the interface material with an object.

44. The method of claim 43, further comprising:
curing the deformable material while the object contacts the interface material.

45. The method of claim 43, further comprising:
hardening the deformable material while the object contacts the interface material.

46. The method of claim 43, further comprising:
solidifying the deformable material while the object contacts the interface material.

47. The method of claim 43, further comprising:
applying pressure to the object contacting the interface material while the interface material contacts the deformable material.

48. The method of claim 42, further comprising:
applying pressure to the coating of the deformable material on the nonplanar film surface of the wafer while the interface material contacts the deformable material.

49. The method of claim 43, wherein the object includes a substantially flat planar surface thereon contacting the interface material.

50. The method of claim 43, wherein the object includes a shaped surface thereon contacting the interface material.

51. The method of claim 50, wherein the shaped surface includes a convex surface portion.

52. The method of claim 50, wherein the shaped surface includes a concave surface portion.

53. The method of claim 50, wherein the shaped surface includes a convex surface portion and a concave surface portion.

54. The method of claim 50, wherein the shaped surface includes a desired shaped surface.

55. The method of claim 43, wherein the object includes a flat optical glass object.

56. The method of claim 43, further including:
coating the object with a release agent prior to the contacting the interface material.

57. The method of claim 43, wherein the object includes a substantially inflexible object.

58. The method of claim 37, further comprising:
contacting the wafer with a flexible resilient member.

59. The method of claim 43, wherein a back of the wafer is contacted with a flexible resilient member.

60. The method of claim 59, further comprising:
applying pressure to the flexible resilient member to form a substantially flat planar surface on the deformable material.

61. The method of claim 59, further comprising:
contacting the flexible resilient member with a substrate; and
applying pressure to the substrate thereby applying pressure to the flexible resilient member.

62. The method of claim 59, further comprising:
applying pressure to the wafer by applying pressure to the flexible resilient member thereby applying pressure to the object.

63. The method of claim 37, wherein the wafer includes a wafer having a plurality of electrical circuit components on a surface thereof.

64. The method of claim 37, wherein the wafer includes a wafer having a plurality of electrical circuit components on a surface thereof and a coating substantially covering the plurality of electrical circuit components.

65. The method of claim 37, wherein the wafer includes a wafer having a plurality of electrical circuit components on a surface thereof and a coating substantially covering the plurality of electrical circuit components and the wafer.

66. The method of claim 43, further comprising:
applying pressure to the object while the object is in contact with the interface material.

67. The method of claim 43, further comprising:
applying a substantially uniform pressure to the object while the interface material is in contact with the deformable material.

68. The method of claim 43, further comprising:
applying a substantially uniform pressure to the deformable material on the nonplanar film surface of the wafer to form a substantially flat planar surface on the deformable material.

69. A method for planarizing a nonplanar film surface on a wafer comprising:
securing an interface material in a position relative to the nonplanar film surface on the wafer;
applying a deformable material to the nonplanar film surface of the wafer;
contacting the deformable material with the interface material;
forming a substantially flat planar surface on the deformable material applied to the nonplanar film surface of the wafer; and
applying a fluid under pressure to the interface material.

70. The method of claim 69, further comprising:
applying a vacuum to the interface material.

71. The method of claim 69, further comprising:
planarizing the wafer using a planarization process.

72. The method of claim 71, wherein the planarization process includes a chemical mechanical planarization process.

73. The method of claim 71, wherein the planarization process includes an etching process.

74. A method for planarizing a nonplanar film surface of a wafer comprising:
securing an interface material in a position with respect to said wafer;
providing a wafer having a surface having a nonplanar film theron applying a deformable material to the nonplanar film surface of the wafer;
contacting the interface material with an object having a substantially planar surface thereon;
contacting the deformable material with the interface material;
forming a substantially flat planar surface on the deformable material on the nonplanar film surface of the wafer; and
applying a pressurized fluid to the interface material.

75. The method of claim 74, further comprising:
applying a vacuum to the interface material.

76. The method of claim 74, further comprising:
planarizing the wafer using a planarization process.

77. A method for planarizing a nonplanar film surface on a wafer comprising:
securing an interface material in a position with respect to said wafer;
providing a wafer having a nonplanar film located on a surface thereof;
providing a flexible resilient member at another surface of the wafer;
applying a deformable material to the nonplanar film surface of the wafer;
contacting the deformable material;
forming a substantially flat planar surface on the deformable material on the nonplanar film surface of the wafer using an object having a substantially flat planar surface thereon; and
contacting the interface material using pressurized fluid.

78. The method of claim 77, further comprising:
applying a vacuum to the interface material.

79. The method of claim 77, further comprising:
planarizing the wafer using a planarization process.

80. The method of claim 77, wherein the deformable material is contacted by the interface material.

81. A method for planarizing a nonplanar film surface of a wafer comprising:
providing a wafer having a nonplanar film located on a surface thereof;
securing an interface material secured in a position with respect to said wafer;
providing an object having a substantially flat planar surface thereon;
providing a flexible resilient member;
applying a deformable material to the nonplanar film surface of the wafer;
contacting another surface of the wafer with the flexible resilient member;
applying pressure to the deformable material;
forming a substantially flat planar surface on the deformable material on the nonplanar film surface of the wafer;
contacting the interface material using pressurized fluid; and
planarizing the wafer.

82. The method of claim 81, further comprising:
applying a vacuum to the interface material.

83. A method for planarizing a nonplanar surface of a wafer, the method comprising:
providing a wafer having a nonplanar surface thereon;
securing an interface material secured in a position with respect to said wafer;
forming a substantially flat planar surface on the nonplanar surface of the wafer;
contacting the interface material using pressurized fluid; and
planarizing the wafer.

84. The method of claim 83, further comprising:
applying a vacuum to the interface material.

85. A method for planarizing a nonplanar surface of a wafer having at least one electrical circuit formed thereon comprising:
providing a wafer having a nonplanar surface thereon;
securing an interface material with respect to the nonplanar surface of the wafer;
forming a substantially flat planar surface on the nonplanar surface of the wafer;
contacting the interface material using pressurized fluid; and
planarizing the substantially flat planar surface on the wafer.

86. The method of claim 85, further comprising:
applying a vacuum to the interface material.

87. A method for planarizing a nonplanar surface of a wafer comprising:
providing a wafer having a nonplanar surface thereon;
securing interface material with respect to the nonplanar surface of the wafer;
applying a deformable material to the nonplanar surface of the wafer;
forming a substantially flat planar surface on the deformable material;

contacting the interface material using pressurized fluid; and planarizing the wafer.

88. The method of claim 87, further comprising:

applying a vacuum to the interface material.

89. A method for planarizing a nonplanar surface of a wafer comprising:

securing an interface material with respect to said nonplanar surface of said wafer;

providing an object having a flat planar surface thereon;

applying a deformable material to the nonplanar surface of the wafer;

contacting the deformable material using the interface material;

forming a substantially flat planar surface on the deformable material;

contacting the interface material using fluid; and planarizing the wafer.

90. The method of claim 89, further comprising:

applying a vacuum to the interface material.

91. A method for planarizing a nonplanar surface of a wafer comprising:

providing a wafer having a nonplanar surface;

providing a secured interface material;

providing an object having a substantially flat planar surface thereon;

providing a flexible resilient member adjacent another surface of the wafer;

applying a deformable material to the nonplanar surface of the wafer;

contacting the deformable material;

forming a substantially flat planar surface on the deformable material on the nonplanar surface of the wafer;

contacting the interface material by applying a fluid thereto; and planarizing the wafer.

92. The method of claim 91, further comprising:

applying a vacuum to the interface material.

93. The method of claim 91, wherein the interface material is contacted by an object.

94. A method for planarizing a nonplanar surface of a wafer comprising:

securing an interface material with respect to said nonplanar surface of said wafer;

providing an object having a substantially flat planar surface thereon;

providing a flexible resilient member;

applying a deformable material to the nonplanar surface of the wafer;

contacting another surface of the wafer with the flexible resilient member;

applying pressure to the deformable material;

forming a substantially flat planar surface on the deformable material on the nonplanar surface of the wafer;

contacting the interface material using fluid; and planarizing the wafer.

95. The method of claim 94, further comprising:

applying a vacuum to the interface material.

96. A method for planarizing a nonplanar surface of a wafer comprising:

securing an interface material; with respect to said nonplanar surface of said wafer forming a substantially flat planar surface on the nonplanar surface of the wafer;

removing the interface material from the wafer; and planarizing the substantially flat planar surface on the nonplanar surface of the wafer.

97. The method of claim 96, further comprising:

applying a vacuum to the interface material.

98. A method for planarizing a nonplanar surface of a wafer having at least one electrical circuit formed thereon comprising:

securing an interface material with respect to said wafer;

forming a substantially flat planar surface on the nonplanar surface of the wafer;

separating the interface material from the wafer; and planarizing the substantially flat planar surface on the nonplanar surface of the wafer.

99. The method of claim 98, further comprising:

applying a vacuum to the interface material.

100. A method for planarizing a nonplanar surface of a wafer comprising:

securing an interface material with respect to said wafer;

applying a deformable material to the nonplanar surface of the wafer;

forming a substantially flat planar surface on the deformable material applied to the nonplanar surface of the wafer;

separating the interface material from the wafer; and planarizing the substantially flat planar surface on the nonplanar surface of the wafer.

101. The method of claim 100, further comprising:

applying a vacuum to the interface material.

102. A method for planarizing a nonplanar surface of a wafer comprising:

securing an interface material with respect to said wafer;

providing an object having a substantially flat planar surface thereon;

providing a wafer having a nonplanar surface;

applying a deformable material to the nonplanar surface of the wafer;

contacting the interface material by the object;

contacting the deformable material with the interface material;

forming a substantially flat planar surface on the deformable material on the nonplanar surface of the wafer;

removing the interface material from the wafer; and planarizing the wafer.

103. The method of claim 102, further comprising:

applying a vacuum to the interface material.

104. A method for planarizing a nonplanar surface of a wafer comprising:

securing an interface material substantially retained in a position regarding said wafer;

providing an object having a substantially flat planar surface thereon;

providing a flexible resilient member at another surface of the wafer;

applying a deformable material to the nonplanar surface of the wafer;

contacting the deformable material;

forming a substantially flat planar surface on the deformable material on the nonplanar surface of the wafer;

removing the interface material from the wafer; and planarizing the substantially flat planar surface on the deformable material on the nonplanar surface of the wafer.

105. The method of claim 104, further comprising:
applying a vacuum to the interface material.

106. The method of claim 104, wherein the interface material is contacted by the object.

107. A method for planarizing a nonplanar surface of a wafer comprising:
securing an interface material with respect to said wafer;
providing an object having a substantially flat planar surface thereon;
providing a flexible resilient member;
applying a deformable material to the nonplanar surface of the wafer;
contacting another surface of the wafer using the flexible resilient member;
applying pressure to the deformable material;
forming a substantially flat planar surface on the deformable material on the nonplanar surface of the wafer;
removing the interface material from the wafer using a fluid; and
planarizing the substantially flat planar surface on the deformable material on the nonplanar surface of the wafer.

108. The method of claim 107, further comprising:
applying a vacuum to the interface material.

109. An apparatus for planarization of a surface on a wafer using an object having an upper surface, a lower surface, and an outer diameter comprising:
an interface material located below the lower surface of the object and substantially secured in a position between the lower surface of said object and said surface of said wafer.

110. The apparatus of claim 109, further comprising:
a lid assembly, the lid assembly including the object therein.

111. The apparatus of claim 109, further comprising:
a lid assembly including:
an upper lid;
a middle lid having an upper surface, a lower surface, an inner surface, and an outer surface, the middle lid located between the upper lid and a lower lid; and
the lower lid having a portion thereof located below the lower surface of the object.

112. The apparatus of claim 111, further comprising:
an interface clamp retaining a portion of the interface material between the lower lid and the interface clamp.

113. The apparatus of claim 112, further comprising:
an annular seal sealingly engaging a portion of the object and a portion of the lid assembly.

114. The apparatus of claim 111, wherein the lower lid includes a plurality of apertures therein.

115. The apparatus of claim 111, further comprising:
a chamber located below the lower lid.

116. The apparatus of claim 111, further comprising:
a plurality of fasteners retaining the upper lid to the middle lid.

117. The apparatus of claim 115, further comprising:
a plurality of fasteners retaining the lower lid to the chamber.

118. The apparatus of claim 112, further comprising:
a plurality of fasteners retaining the interface clamp to the middle lid.

119. The apparatus of claim 111, wherein the upper lid comprises a generally cylindrical annular member having an upper surface, an inner diameter surface, a lower surface, an outer diameter surface, and a plurality of apertures extending from the upper surface to the lower surface.

120. The apparatus of claim 111, wherein the lower lid comprises a generally cylindrical annular member having an upper surface, a first vertical inner cylindrical surface, an inner annular surface, a second vertical inner cylindrical surface, a bottom surface, an outer cylindrical surface, and a plurality of apertures for receiving portions of fasteners therein.

121. The apparatus of claim 111, wherein the middle lid comprises a generally cylindrical annular member having an upper surface, a frustoconical annular inner surface, an inner cylindrical surface, a first cylindrical annular surface, a first vertical outer diameter surface, a second cylindrical annular surface, a second vertical outer diameter surface, at least one aperture for supplying a gas therethrough, and at least one annular seal for sealingly engaging a portion of the object, the middle lid located between the upper lid and the lower lid.

122. The apparatus of claim 111, further comprising:
an interface clamp connected to the middle lid retaining a portion of the interface material between the lower lid and the interface clamp.

123. The apparatus of claim 111, wherein the middle lid comprises a generally cylindrical annular member having an upper surface, a frustoconical annular inner surface, an inner cylindrical surface, a first cylindrical annular surface, a first vertical outer diameter surface, a second cylindrical annular surface, a second vertical outer diameter surface, at least one aperture for supplying a gas therethrough, and at least one annular seal for sealing engaging a portion of the object, the middle lid located between the upper lid and the lower lid.

124. The apparatus of claim 123, further comprising:
an interface clamp connected to the middle lid retaining a portion of the interface material between the lower lid and the interface clamp.

125. The apparatus of claim 124, wherein the inner cylindrical surface of the middle lid includes an annular cylindrical lip having a plurality of radially extending grooves therein.

126. The apparatus of claim 111, wherein the middle lid comprises a generally cylindrical annular member having a first upper surface, a vertical cylindrical surface, a second upper surface, a first inner diameter vertical surface, an annular cylindrical surface, a second inner diameter vertical surface, a lower surface, an outer diameter surface, at least one aperture for supplying a gas therethrough, and at least one annular seal for sealing engaging a portion of the object, the middle lid located between the upper lid and the lower lid.

127. The apparatus of claim 126, further comprising:
an interface clamp connected to the middle lid retaining a portion of the interface material between the lower lid and the interface clamp.

128. The apparatus of claim 111, further comprising:
a lid clamp located between the upper lid and the middle lid.

129. The apparatus of claim 111, further comprising:
an object clamp located between the upper lid and the middle lid; and
a lid clamp located between the upper lid and the middle lid, the lid clamp further located outside the object clamp.

130. An apparatus for planarization of a surface on a wafer using an object having an upper surface, lower surface, and outer diameter, comprising:

an upper lid located above said object;

a middle lid;

a secured interface material located below the lower surface of the object; and a lower lid having a portion thereof located below the lower surface of the object.

131. The apparatus of claim 130, further comprising:

an interface clamp retaining a portion of the interface material between the middle lid and the interface clamp.

132. The apparatus of claim 130, further comprising:

an annular seal located on the middle lid sealingly engaging a portion of the object.

133. The apparatus of claim 130, wherein the lower lid includes a plurality of apertures therein.

134. The apparatus of claim 130, wherein the middle lid includes an annular seal sealingly engaging a portion of the object.

135. The apparatus of claim 130, further comprising:

a chamber located below the lower lid.

136. The apparatus of claim 130, further comprising:

a plurality of fasteners retaining the upper lid to the middle lid.

137. The apparatus of claim 135, further comprising:

a plurality of fasteners retaining the lower lid to the chamber.

138. The apparatus of claim 131, further comprising:

a plurality of fasteners retaining the interface clamp to the middle lid.

139. The apparatus of claim 130, further comprising:

an object clamp located between the upper lid and the middle lid; and a lid clamp located between the upper lid and the middle lid.

140. The apparatus of claim 130, wherein the upper lid comprises a generally cylindrical annular member having an upper surface, an inner diameter surface, a lower surface, an outer diameter surface, and a plurality of apertures extending from the upper surface to the lower surface.

141. The apparatus of claim 130, wherein the lower lid comprises a generally cylindrical annular member having an upper surface, a first vertical inner cylindrical surface, an inner annular surface, a second vertical inner cylindrical surface, a bottom surface, an outer cylindrical surface, and a plurality of apertures for receiving portions of fasteners therein.

142. The apparatus of claim 130, wherein the middle lid comprises a generally cylindrical annular member having an upper surface, a frustoconical annular inner surface, an inner cylindrical surface, a first cylindrical annular surface, a first vertical outer diameter surface, a second cylindrical annular surface, a second vertical outer diameter surface, at least one aperture for supplying a gas therethrough, and at least one annular seal for sealingly engaging a portion of the object, the middle lid located between the upper lid and the lower lid.

143. The apparatus of claim 142, further comprising:

an interface clamp connected to the middle lid retaining a portion of the interface material between the lower lid and the interface clamp.

144. The apparatus of claim 130, wherein the middle lid comprises a generally cylindrical annular member having an upper surface, a frustoconical annular inner surface, an inner cylindrical surface, a first cylindrical annular surface, a first vertical outer diameter surface, a second cylindrical annular surface, a second vertical outer diameter surface, at least one aperture for supplying a gas therethrough, and at least one annular seal for sealingly engaging a portion of the object, the middle lid located between the upper lid and the lower lid.

145. The apparatus of claim 130, further comprising:

an interface clamp connected to the middle lid retaining a portion of the interface material between the lower lid and the interface clamp.

146. The apparatus of claim 144, wherein the inner cylindrical surface of the middle lid further comprises an annular cylindrical lip having a plurality of radially extending grooves therein.

147. The apparatus of claim 130, wherein the middle lid comprises a generally cylindrical annular member having a first upper surface, a vertical cylindrical surface, a second upper surface, a first inner diameter vertical surface, an annular cylindrical surface, a second inner diameter vertical surface, a lower surface, an outer diameter surface, at least one aperture for supplying a gas therethrough, and at least one annular seal for sealingly engaging a portion of the object, the middle lid located between the upper lid and the lower lid.

148. An apparatus for planarization of a surface on a wafer using an object having an upper surface, lower surface, and outer diameter, comprising:

a lid assembly comprising:

an upper lid having a portion located above said object;

a middle lid;

a secured interface material located below the lower surface of the object;

a lower lid located below the middle lid; and a chamber located below the lid assembly, the chamber comprising:

a platform located in the chamber.

149. The apparatus of claim 148, further comprising:

a resilient member located on the platform in the chamber.

150. The apparatus of claim 148, further comprising:

an interface clamp retaining a portion of the interface material between the middle lid and the interface clamp.

151. The apparatus of claim 148, further comprising:

an annular seal located on a portion of the middle lid sealingly engaging the portion of the object.

152. The apparatus of claim 148, wherein the lower lid further comprises a plurality of apertures therein.

153. The apparatus of claim 148, further comprising:

a plurality of fasteners retaining the upper lid to the middle lid.

154. The apparatus of claim 148, further comprising:

a plurality of fasteners retaining the lower lid to the chamber.

155. The apparatus of claim 150, further comprising:

a plurality of fasteners retaining the interface clamp to the lower lid.

156. The apparatus of claim 148, wherein the upper lid comprises a generally cylindrical annular member having an upper surface, an inner diameter surface, a lower surface, an outer diameter surface, and a plurality of apertures extending from the upper surface to the lower surface.

157. The apparatus of claim 148, wherein the lower lid comprises a generally cylindrical annular member having an upper surface, a first vertical inner cylindrical surface, an inner annular surface, a second vertical inner cylindrical surface, a bottom surface, an outer cylindrical surface, and a plurality of apertures for receiving portions of fasteners therein.

158. The apparatus of claim 148, wherein the middle lid comprises a generally cylindrical annular member having an upper surface, a frustoconical annular inner surface, an inner cylindrical surface, a first cylindrical annular surface, a first vertical outer diameter surface, a second cylindrical annular surface, a second vertical outer diameter surface, at least one aperture for supplying a gas therethrough, and at least one annular seal for sealingly engaging the portion of the object, the middle lid located between the upper lid and the lower lid.

159. The apparatus of claim 158, further comprising:
an interface clamp connected to the middle lid retaining a portion of the interface material between the lower lid and the interface clamp.

160. The apparatus of claim 148, wherein the middle lid comprises a generally cylindrical annular member having an upper surface, a frustoconical annular inner surface, an inner cylindrical surface, a first cylindrical annular surface, a first vertical outer diameter surface, a second cylindrical annular surface, a second vertical outer diameter surface, at least one aperture for supplying a gas therethrough, and at least one annular seal for sealingly engaging the portion of the object, the middle lid located between the upper lid and the lower lid.

161. The apparatus of claim 160, further comprising:
an interface clamp connected to the middle lid retaining a portion of the interface material between the lower lid and the interface clamp.

162. The apparatus of claim 160, wherein the inner cylindrical surface of the middle lid further comprises an annular cylindrical lip having a plurality of radially extending grooves therein.

163. The apparatus of claim 148, wherein the middle lid comprises a generally cylindrical annular member having a first upper surface, a vertical cylindrical surface, a second upper surface, a first inner diameter vertical surface, an annular cylindrical surface, a second inner diameter vertical surface, a lower surface, an outer diameter surface, at least one aperture for supplying a gas therethrough, and at least one annular seal for sealingly engaging the portion of the object, the middle lid located between the upper lid and the lower lid.

164. The apparatus of claim 163, further comprising:
an interface clamp connected to the middle lid retaining a portion of the interface material between the lower lid and the interface clamp.

165. The apparatus of claim 148, further comprising:
an object clamp located between the upper lid and the middle lid.

166. The apparatus of claim 148, further comprising:
a lid clamp located between the upper lid and the middle lid.

167. The apparatus of claim 148, further comprising:
an object clamp located between the upper lid and the middle lid; and
a lid clamp located between the upper lid and the middle lid, the lid clamp further located outside the object clamp.

168. An apparatus for planarization of a surface on a wafer using an object comprising:
an upper lid including an upper surface, an inner diameter surface, a lower surface, an outer diameter surface, and a plurality of apertures extending from the upper surface to the lower surface;
a lid clamp including an upper surface, an inner diameter surface, a lower surface, an outer diameter surface, and a plurality of apertures extending from the upper surface to the lower surface, the lid clamp located below the upper lid;
a middle lid including a generally cylindrical annular member having an upper surface, a frustoconical annular inner surface, an inner cylindrical surface, a first vertical outer diameter surface, a first cylindrical annular surface having a plurality of threaded blind apertures therein, a second cylindrical annular surface, a second vertical outer diameter surface, at least one aperture for supplying a gas therethrough, a plurality of threaded apertures, and at least one annular seal for sealingly engaging a portion of an object, the middle lid located between the upper lid and a lower lid;
a generally cylindrical annular member having an upper surface, a lower surface, and an outer diameter having portions thereof sealingly engaging the at least one annular seal in the first vertical outer diameter surface of the middle lid and the at least one annular seal in the annular inner surface of the middle lid, said object located below the upper lid and in the middle lid within the generally cylindrical annular member;
an object clamp including a generally cylindrical annular member having an upper surface, an inner diameter vertical surface, a frustoconical annular surface, a lower surface and an outer diameter surface;
an annular seal having a portion thereof abutting the object clamp and the middle lid;
a secured interface material located below the lower surface of the object;
the lower lid having a portion thereof located below the lower surface of the object, the lower lid including an upper surface having an annular seal groove therein having an annular seal therein sealingly engaging the second cylindrical annular surface of the middle lid, a first vertical inner diameter surface, a first vertical inner cylindrical surface, an inner annular surface having a plurality of blind apertures therein, a second vertical inner cylindrical surface, a bottom surface having an annular seal groove therein having an annular seal therein, an outer diameter surface, an outer diameter cylindrical surface, and a plurality of apertures extending from the upper surface to the bottom surface;
an interface clamp including a generally cylindrical annular member having an upper surface, an inner cylindrical surface, a lower surface, an outer cylindrical surface, and a plurality of threaded apertures extending from the upper surface to the lower surface;
an annular seal located between the upper lid and the lid clamp and the object clamp;
an annular seal located between the lid clamp and the middle lid;
a plurality of threaded fasteners, each threaded fastener of the plurality of threaded fasteners extending through the upper lid, extending through the lid clamp, and engaging a portion of a threaded aperture of the plurality of threaded apertures of the middle lid thereinto; and
a plurality of threaded fasteners, each threaded fastener of the plurality of threaded fasteners extending through the interface clamp and engaging a portion of a threaded blind aperture of the plurality of threaded blind apertures extending from the first cylindrical annular surface of the middle lid thereinto.

169. An apparatus for planarization of a surface on a wafer using an object comprising:

an upper lid including a generally cylindrical annular member having an upper surface, an inner diameter surface, a lower surface, an outer diameter surface, and a plurality of apertures extending from the upper surface to the lower surface;

a lid clamp including a generally cylindrical annular member having an upper surface, an inner cylindrical surface, a lower surface, an outer cylindrical surface, and a plurality of apertures extending therethrough;

a middle lid including a generally cylindrical annular member having an upper surface, a frustoconical annular inner surface, an inner cylindrical surface, an annular cylindrical lip having a plurality of radially extending grooves therein, a first cylindrical annular surface having a plurality of threaded blind apertures therein, a first vertical outer diameter surface, a second cylindrical annular surface, a second vertical outer diameter surface, at least one aperture extending from the second vertical outer diameter surface to the inner cylindrical surface for the flow of fluid therethrough, and a plurality of threaded apertures;

a lower lid including a generally cylindrical annular member having a portion thereof located below a lower surface of an object, the lower lid including an upper surface having an annular seal groove therein having an annular seal therein, a first vertical inner cylindrical surface, an inner annular surface having a plurality of blind apertures therein, a second vertical inner cylindrical surface, a bottom surface having an annular seal groove therein having an annular seal therein, an outer diameter cylindrical surface, and a plurality of apertures extending therethrough from the upper surface to the bottom surface;

an interface clamp including a generally cylindrical annular member having an upper surface, an inner cylindrical surface, a lower surface, an outer diameter surface, and a plurality of apertures extending therethrough;

an interface material located below the lower surface of the object;

an object clamp including a generally cylindrical annular member having an upper surface, a first vertical inner diameter surface, a second vertical inner diameter surface, a frustoconical annular surface, a lower surface, an outer diameter surface, and a plurality of apertures extending from the upper surface to the lower surface, the object clamp having at least a portion of said object located therein;

an annular seal located between the upper lid and the lid clamp and the object clamp;

an annular seal located between the lid clamp and the middle lid;

a plurality of threaded fasteners, each threaded fastener extending through the upper lid and engaging a portion of an aperture of the plurality of threaded apertures extending from the upper surface of the middle lid to the second cylindrical annular surface thereof, and a plurality of threaded fasteners, each threaded fastener extending through an aperture of the plurality of apertures in the interface clamp and engaging a portion of a blind threaded aperture of the plurality of blind threaded apertures extending from the first cylindrical annular surface of the middle lid thereinto.

170. An apparatus for planarization of a surface on a wafer using an object comprising:

an upper lid including a generally cylindrical annular member having an upper surface, an inner diameter surface, a lower surface, an outer diameter surface, and a plurality of apertures extending from the upper surface to the lower surface;

a lid clamp including a generally cylindrical annular member having an upper surface, an inner cylindrical surface, a lower surface, an outer cylindrical surface, and a plurality of apertures extending from the upper surface to the lower surface, the lid clamp located below the upper lid;

a middle lid including a generally cylindrical annular member having a first upper surface, a vertical cylindrical surface, a second upper surface, a first inner diameter vertical surface having annular groove therein having an annular seal therein, an annular cylindrical surface having an annular groove therein having an annular seal therein, a second inner diameter vertical surface, a lower surface, an outer diameter surface, at least one aperture extending from the outer diameter surface to the second inner diameter vertical surface for the supply of fluid therethrough, a plurality of threaded apertures extending from the lower surface, and a plurality of threaded apertures extending from the first upper surface;

a lower lid including a generally cylindrical annular member having an upper surface having an annular seal groove therein having an annular seal therein, a first vertical inner cylindrical surface, an inner annular surface having a plurality of blind apertures therein, a second vertical inner cylindrical surface, a lower surface having an annular seal groove therein having an annular seal therein, an outer diameter cylindrical surface, a plurality of apertures extending from the upper surface to the lower surface;

an interface clamp including a generally cylindrical annular member having an upper surface, an inner diameter, a lower surface, an inner annular extending lip, and a plurality of apertures;

an interface material located below the lower surface of the object;

an annular seal located between the upper lid and the lid clamp and the middle lid;

an annular seal located between the lid clamp and the middle lid;

a plurality of threaded fasteners, each threaded fastener of the plurality of threaded fasteners extending through the upper lid, extending through the lid clamp, and engaging a portion of a threaded aperture of the another plurality of threaded apertures extending from the first upper surface of the middle lid thereinto; and a plurality of threaded fasteners, each threaded fastener of the plurality of threaded fasteners extending through the interface clamp and engaging a portion of a threaded aperture of the plurality of threaded apertures extending from the lower surface of the middle lid thereinto.

171. An apparatus for planarization of a surface on a wafer using an object comprising:

an upper lid including a generally cylindrical annular member having an upper surface, an inner diameter surface, a lower surface, an outer diameter surface, and a plurality of apertures extending from the upper surface to the lower surface;

a lid clamp including a generally cylindrical annular member having an upper surface, an inner cylindrical surface, a lower surface, an outer cylindrical surface, and a plurality of apertures extending therethrough;

a middle lid including a generally cylindrical annular member having an upper surface, a frustoconical annular inner surface, an inner cylindrical surface, a first lower surface, a first vertical outer diameter, a second lower surface, a second vertical outer diameter, and a plurality of apertures extending from the upper surface to the second lower surface;

a lower lid including a generally cylindrical annular member having an upper surface having an annular seal groove therein having an annular seal therein, a first vertical inner cylindrical surface, an inner annular surface, a second vertical inner cylindrical surface, a bottom surface having an annular seal groove therein having an annular seal therein, an outer diameter cylindrical surface, and a plurality of apertures extending from the upper surface to the bottom surface;

an object clamp including a generally cylindrical annular member having an upper surface, an inner diameter vertical surface, a frustoconical annular surface, a lower surface, and an outer diameter surface;

an interface material located below the object and below the bottom surface of the lower lid;

an annular seal located between the upper lid and the lid clamp and the object clamp;

an annular seal located between the lid clamp and the middle lid; and a plurality of threaded fasteners, each threaded fastener extending through the upper lid and engaging a portion of an aperture of the plurality of apertures extending from the upper surface of the middle lid thereinto.

172. An apparatus for planarization of a surface on a wafer using an object comprising:

a lid assembly comprising:

an upper lid including a generally cylindrical annular member having an upper surface, an inner diameter surface, a lower surface, an outer diameter surface, and a plurality of apertures extending from the upper surface to the lower surface;

a lid clamp including a generally cylindrical annular member having an upper surface, an inner diameter surface, a lower surface, an outer diameter surface, and a plurality of apertures extending from the upper surface to the lower surface, the lid clamp located below the upper lid;

a middle lid including a generally cylindrical annular member having an upper surface, a frustoconical annular inner surface, an inner cylindrical surface, a first vertical outer diameter surface, a first cylindrical annular surface having a plurality of threaded blind apertures therein, a second cylindrical annular surface, a second vertical outer diameter surface, at least one aperture for supplying a gas therethrough, a plurality of threaded apertures, and at least one annular seal for sealingly engaging a portion of an object, the middle lid located between the upper lid and a lower lid;

an object clamp including a generally cylindrical annular member having an upper surface, an inner diameter vertical surface, a frustoconical annular surface, a lower surface and an outer diameter surface;

an annular seal having a portion thereof abutting the object clamp and the middle lid;

an interface material located below the object;

the lower lid having a portion thereof located below the lower surface of the object, the lower lid including a generally cylindrical annular member having an upper surface having an annular seal groove therein having an annular seal therein sealingly engaging the second cylindrical annular surface of the middle lid, a first vertical inner diameter surface, a first vertical inner cylindrical inner surface, an inner annular surface having a plurality of blind apertures therein, a second vertical inner cylindrical surface, a bottom surface having an annular seal groove therein having an annular seal therein, an outer diameter surface, an outer diameter cylindrical surface, and a plurality of apertures extending from the upper surface to the bottom surface;

an interface clamp including a generally cylindrical annular member having an upper surface, an inner cylindrical surface, a lower surface, an outer cylindrical surface, and a plurality of threaded apertures extending from the upper surface to the lower surface;

an annular seal located between the upper lid and the lid clamp and the object clamp;

an annular seal located between the lid clamp and the middle lid;

a plurality of threaded fasteners, each threaded fastener of the plurality of threaded fasteners extending through the upper lid, extending through the lid clamp, and engaging a portion of a threaded aperture of the plurality of threaded apertures of the middle lid thereinto;

a plurality of threaded fasteners, each threaded fastener of the plurality of threaded fasteners extending through the interface clamp and engaging a portion of a threaded blind aperture of the plurality of threaded blind apertures extending from the first cylindrical annular surface of the middle lid thereinto; and a chamber located below the lid assembly, the chamber including:

a platform located in the chamber.

173. The apparatus of claim 172, further comprising:
a resilient member located on the platform.

174. The apparatus of claim 172, further comprising:
a thermocouple for measuring a temperature in the chamber.

175. An apparatus for planarization of a surface on a wafer using an object comprising:

a lid assembly comprising:

an upper lid including a generally cylindrical annular member having an upper surface, an inner diameter surface, a lower surface, an outer diameter surface, and a plurality of apertures extending from the upper surface to the lower surface;

a lid clamp including a generally cylindrical annular member having an upper surface, an inner cylindrical surface, a lower surface, an outer cylindrical surface, and a plurality of apertures extending therethrough;

a middle lid including a generally cylindrical annular member having an upper surface, a frustoconical annular inner surface, an inner cylindrical surface, an annular cylindrical lip having a plurality of radially extending grooves therein, a first cylindrical annular surface having a plurality of threaded blind apertures therein, a first vertical outer diameter surface, a second cylindrical annular surface, a second vertical outer diameter surface, at least one aperture extending from the second vertical outer diameter surface to the inner cylindrical surface for the flow of fluid therethrough, and a plurality of threaded apertures;

a lower lid including a generally cylindrical annular member having an upper surface having an annular seal groove therein having an annular seal therein, a first vertical inner cylindrical surface, an inner annular surface having a plurality of blind apertures therein, a second vertical inner cylindrical surface, a bottom surface having an annular seal groove therein having an annular seal therein, an outer diameter cylindrical surface, and a plurality of apertures extending therethrough from the upper surface to the bottom surface;

an interface clamp including a generally cylindrical annular member having an upper surface, an inner cylindrical surface, a lower surface, an outer diameter surface, and a plurality of apertures extending therethrough;

an interface material located and retained below the object;

an object clamp including a generally cylindrical annular member having an upper surface, a first vertical inner diameter surface, a second vertical inner diameter surface, a frustoconical annular surface, a lower surface, an outer diameter surface, and a plurality of apertures extending from the upper surface to the lower surface;

an annular seal located between the upper lid and the lid clamp and the object clamp;

an annular seal located between the lid clamp and the middle lid;

a plurality of threaded fasteners, each threaded fastener of the plurality of threaded fasteners extending through the upper lid and engaging a portion of a threaded aperture of the plurality of threaded apertures extending from the upper surface of the middle lid to the second cylindrical annular surface thereof; and a plurality of threaded fasteners, each threaded fastener of the plurality of threaded fasteners extending through an aperture of the plurality of apertures in the interface clamp and engaging a portion of a blind threaded aperture of the plurality of blind threaded apertures extending from the first cylindrical annular surface of the middle lid thereinto; and a chamber located below the lid assembly, the chamber including:

a platform located in the chamber.

176. The apparatus of claim 175, further comprising:

a resilient member located on the platform.

177. The apparatus of claim 175, further comprising:

a thermocouple for measuring a temperature in the chamber.

178. An apparatus for planarization of a surface on a wafer using an object comprising:

a lid assembly comprising:

an upper lid including a generally cylindrical annular member having an upper surface, an inner diameter surface, a lower surface, an outer diameter surface, and a plurality of apertures extending from the upper surface to the lower surface;

a lid clamp including a generally cylindrical annular member having an upper surface, an inner cylindrical surface, a lower surface, an outer cylindrical surface, and a plurality of apertures extending from the upper surface to the lower surface, the lid clamp located below the upper lid;

a middle lid including a generally cylindrical annular member having a first upper surface, a vertical cylindrical surface, a second upper surface, a first inner diameter vertical surface having an annular groove therein having an annular seal therein, an annular cylindrical surface having an annular groove therein having an annular seal therein, a second inner diameter vertical surface, a lower surface, an outer diameter surface, at least one aperture extending from the outer diameter surface to the second inner diameter vertical surface for the supply of fluid therethrough, and a plurality of threaded apertures extending from the lower surface, and a plurality of threaded apertures extending from the first upper surface;

a lower lid including a generally cylindrical annular member having an upper surface having an annular seal groove therein having an annular seal therein, a first vertical inner cylindrical surface, an inner annular surface having a plurality of blind apertures therein, a second vertical inner cylindrical surface, a lower surface having an annular seal groove therein having an annular seal therein, an outer diameter cylindrical surface, a plurality of apertures extending from the upper surface to the lower surface;

an interface clamp including a generally cylindrical annular member having an upper surface, an inner diameter, a lower surface, an inner annular extending lip, and a plurality of apertures;

an interface material located below the object;

an annular seal located between the upper lid and the lid clamp and the middle lid;

an annular seal located between the lid clamp and the middle lid;

a plurality of threaded fasteners, each threaded fastener of the plurality of threaded fasteners extending through the upper lid, extending through the lid clamp, and engaging a portion of a threaded aperture of the plurality of threaded apertures extending from the first upper surface of the middle lid thereinto; and a plurality of threaded fasteners, each threaded fastener extending through the interface clamp and engaging a portion of a threaded aperture of the plurality of threaded apertures extending from the lower surface of the middle lid thereinto; and a chamber located below the lid assembly, the chamber including:

a platform located in the chamber.

179. The apparatus of claim 178, further comprising:

a resilient member located on the platform.

180. The apparatus of claim 178, further comprising:

a thermocouple for measuring a temperature in the chamber.

181. An apparatus for planarization of a surface on a wafer using an object comprising:

a lid assembly comprising:

an upper lid including a generally cylindrical annular member having an upper surface, an inner diameter surface, a lower surface, an outer diameter surface, and a plurality of apertures extending from the upper surface to the lower surface;

a lid clamp including a generally cylindrical annular member having an upper surface, an inner cylindrical surface, a lower surface, an outer cylindrical surface, and a plurality of apertures extending therethrough;

a middle lid including a generally cylindrical annular member having an upper surface, a frustoconical annular inner surface, an inner cylindrical surface, a first lower surface, a first vertical outer diameter, a second lower surface, a second vertical outer diameter, and a plurality of apertures extending from the upper surface to the second lower surface;

a lower lid including a generally cylindrical annular member having an upper surface having an annular seal groove therein having an annular seal therein, a first vertical inner cylindrical surface, an inner annular surface, a second vertical inner cylindrical surface, a bottom surface having an annular seal groove therein having an annular seal therein, an outer diameter cylindrical surface, and a plurality of apertures extending from the upper surface to the bottom surface;

an object clamp including a generally cylindrical annular member having an upper surface, an inner diameter vertical surface, a frustoconical annular surface, a lower surface, and an outer diameter surface;

an interface material located below the object and below the bottom surface of the lower lid;

an annular seal located between the upper lid and the lid clamp and the object clamp;

an annular seal located between the lid clamp and the middle lid; and a plurality of threaded fasteners, each threaded fastener extending through the upper lid and engaging a portion of an aperture of the plurality of apertures extending from the upper surface of the middle lid thereinto; and a chamber located below the lid assembly, the chamber including:

a platform located in the chamber.

182. The apparatus of claim 181, further comprising:

a resilient member located on the platform.

183. The apparatus of claim 181, further comprising:

a thermocouple for measuring a temperature in the chamber.

\* \* \* \* \*